United States Patent [19]

Hutter et al.

[11] Patent Number: 5,527,722

[45] Date of Patent: Jun. 18, 1996

[54] METHOD OF FABRICATION OF A SEMICONDUCTOR DEVICE HAVING HIGH-AND LOW-VOLTAGE MOS TRANSISTORS

[75] Inventors: Louis N. Hutter, Richardson; Jeffrey P. Smith, Plano, both of Tex.

[73] Assignee: Texas Instruments Incoporated, Dallas, Tex.

[21] Appl. No.: 438,119

[22] Filed: May 8, 1995

Related U.S. Application Data

[63] Continuation of Ser. No. 149,581, Nov. 9, 1993, Pat. No. 5,427,887.

[51] Int. Cl.[6] .................. H01L 21/265; H01L 21/70; H01L 27/00
[52] U.S. Cl. .................. 437/34; 437/57; 437/58
[58] Field of Search .................. 437/34, 57, 59, 437/56

[56] References Cited

U.S. PATENT DOCUMENTS

| | | | |
|---|---|---|---|
| 4,435,895 | 3/1984 | Parrillo et al. | 29/571 |
| 4,530,150 | 7/1985 | Shirato | 29/576 |
| 4,717,684 | 1/1988 | Katto et al. | 437/34 |
| 5,023,190 | 6/1991 | Lee et al. | 437/56 |
| 5,061,649 | 10/1991 | Takenouchi et al. | 437/44 |
| 5,105,252 | 4/1992 | Kim et al. | 357/43 |
| 5,278,441 | 1/1994 | Kang et al. | 257/371 |
| 5,352,620 | 10/1994 | Komori et al. | 437/43 |

*Primary Examiner*—George Fourson
*Assistant Examiner*—Brian K. Dutton
*Attorney, Agent, or Firm*—W. James Brady, III; Richard L. Donaldson

[57] ABSTRACT

A semiconductor device (76) is provided with a high-voltage portion including NMOS transistor (78) and PMOS transistor (82b) and a low-voltage portion including NMOS transistor (80) and PMOS transistor 82(a). The high-voltage NMOS transistor (78) includes source/drain regions (90a, 90b) having N− regions ($90a_1$, $90b_1$) that are self-aligned with a gate (78) and N+ regions ($90a_2$, $90b_2$) that are self-aligned with sidewall spacers (91) formed on sidewalls of the gate (78) to improve reliability under continuous high voltage operating conditions. The low voltage NMOS transistor includes source/drain regions (92a, 92b) that are self-aligned with sidewall spacers (92) to permit channel lengths to be scaled to less than 2 microns. The low-voltage PMOS transistor (82a) and high-voltage PMOS transistor (82b) include source/drain regions (116a–16d) that are self-aligned with sidewall spacer extension regions (110a) formed over sidewall spacers (91) permitting low-voltage PMOS transistor channel lengths to be scaled to less than 2 microns.

15 Claims, 21 Drawing Sheets

5,527,722

METHOD OF FABRICATION OF A SEMICONDUCTOR DEVICE HAVING HIGH-AND LOW-VOLTAGE MOS TRANSISTORS

This is a continuation of application Ser. No. 08/149,581, filed Nov. 9, 1993, now U.S. Pat. No. 5,427,887.

FIELD OF THE INVENTION

This invention relates generally to semiconductor devices and, more particularly, to a semiconductor device having both high- and low-voltage MOS transistors and a method of fabrication thereof.

BACKGROUND OF THE INVENTION

It is often necessary in linear mixed-signal CMOS and BiCMOS integrated circuit devices to merge low-voltage (5 volts, for example) and high-voltage (10–15 volts, for example) CMOS devices. Generally, the low-voltage CMOS devices are used for digital logic, while the high-voltage CMOS devices are used in the analog portion of the circuit design.

One approach presently used to integrate low-voltage digital and high-voltage analog CMOS devices in a mixed-signal integrated circuit device is to use a conventional digital CMOS process to form both the low-voltage digital CMOS devices and the high-voltage analog CMOS devices. Conventional digital CMOS processes are designed to optimize digital performance by forming shallow source/drain (S/D) junctions, heavily doped twin-wells, and single-doped drain (SDD) NMOS devices. When such a process is used to form a mixed-signal CMOS or BiCMOS integrated circuit device, both the low-voltage digital CMOS devices and the high-voltage analog CMOS devices have shallow S/D junctions, heavily doped twin-wells, and SDD NMOS devices.

A drawback to the use of such conventional digital processes to integrate low-voltage digital and high-voltage analog CMOS devices in a mixed-signal integrated circuit device is the lack of reliability of the NMOS transistors in the high-voltage analog portion of the device when operated continuously at a high voltage (10–15V) as required in most analog applications. This lack of reliability is due to hot-electron degradation attributable to the shallow junctions and the single impurity doping of the S/D regions of these NMOS transistors and the heavy doping of the P-wells in which these NMOS transistors are formed.

Another approach presently used to integrated low-voltage digital and high-voltage analog CMOS devices in a mixed-signal integrated circuit device is to use a conventional analog process. Conventional analog CMOS processes are designed to optimize analog performance by forming deep S/I) junctions for higher curvature-induced breakdown voltages, lightly doped wells for lower S/D junction capacitance, and lightly-doped drain (LDD) transistors for improved hot-electron performance at the higher analog operating voltages. When such a process is used to form a mixed-signal CMOS or BiCMOS integrated circuit device, both the low-voltage digital CMOS devices and the high-voltage analog CMOS devices have deep S/D junctions, lightly doped wells, and LDD NMOS transistors.

A drawback to the use of such conventional analog processes to integrate low-voltage digital and high-voltage analog CMOS devices in a mixed-signal integrated circuit device is the susceptibility of the PMOS and NMOS transistors in the low-voltage digital portion of the device to short-channel problems, such as punch-through breakdown, when their channel lengths are scaled to less than approximately 2 microns.

A need therefore exists for a semiconductor device having both: 1.) low-voltage MOS devices having channel lengths scalable to less than 2 microns and 2.) reliable high-voltage MOS devices.

BRIEF DESCRIPTION OF THE DRAWINGS

In the drawings.

Corresponding numerals and symbols in the different figures refer to corresponding parts unless otherwise indicated.

DETAILED DESCRIPTION OF THE INVENTION

Figure 1:
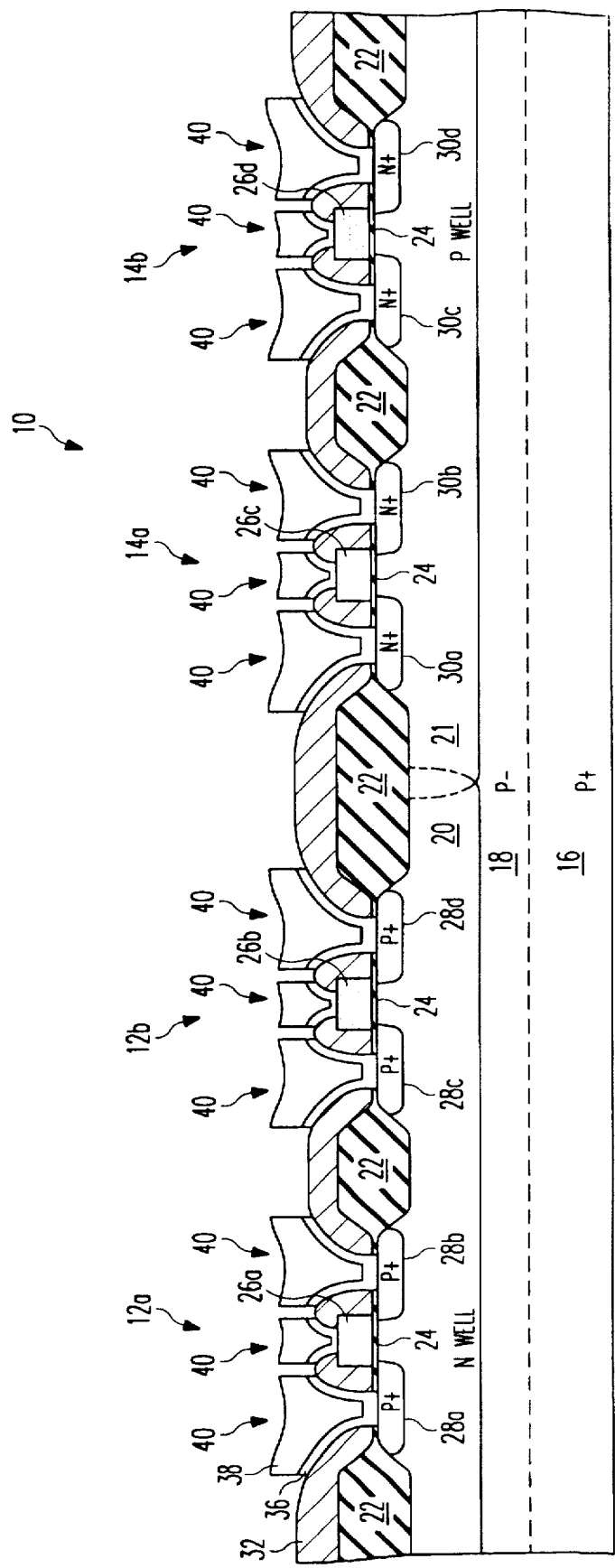
FIG. 1 is a cross-sectional elevation view of a mixed-signal CMOS device fabricated by a digital process according to the prior art.

FIG. 1 is a cross-sectional elevation view of a mixed-signal semiconductor device 10 according to the prior art fabricated by a conventional digital process. Semiconductor device 10 has a high-voltage CMOS transistor pair for analog applications that includes PMOS transistor 12a and NMOS transistor 14a and a low-voltage CMOS transistor pair for digital applications that includes PMOS transistor 12b and NMOS transistor 14b.

Semiconductor device 10 includes a P+ substrate 16 of silicon on which a P– epitaxial layer 18 is formed. Heavily doped N well 20 and heavily doped P well 21 are formed in epitaxial layer 18. Field oxide regions 22 are formed at the surface of semiconductor device 10 and are spaced apart by gate oxide layer 24. PMOS transistor 12a includes a polysilicon gate 26a formed over gate oxide layer 24 and a pair of shallow, P+ single doped source/drain (SDD) regions 28a and 28b that are self-aligned with gate 26a and formed by implanting a single impurity, such as boron, in N well 20. PMOS transistor 12b includes a polysilicon gate 26b formed over gate oxide layer 24 and a pair of shallow, P+ single doped source/drain (SDD) regions 28c and 28d that are self-aligned with gate 26b and formed by implanting a single impurity, such as boron, in N well 20. NMOS transistor 14a includes a polysilicon gate 26c formed over gate oxide layer 24 and a pair of shallow, N+ single doped source/drain (SDD) regions 30a and 30b that are self-aligned with gate 26c and formed by implanting a single impurity, such as arsenic, in P well 21. NMOS transistor 14b includes a polysilicon gate 26d formed over gate oxide layer 24 and a pair of shallow, N+ single doped source/drain (SDD) regions 30c and 30d that are self-aligned with gate 26d and formed by implanting a single impurity, such as arsenic, in P well 21.

A doped glass layer (MLO) 32 is formed over field oxide regions 22, gate oxide layer 24, and gates 26a–d. Layer 32 is patterned and etched to form windows extending through layer 32 to expose contact areas on gates 26a–26d and through layer 32 and oxide layer 24 to expose contact areas on source/drain regions 28a–28d and 30a–30d. First and second metal layers 36 and 38, of TiW and Al-Si-Cu, respectively, are deposited over device 10 and patterned and etched to form contacts 40.

The conventional digital process used to form semiconductor device 10 results in NMOS transistors 12a and 12b having the same structure and PMOS transistors 14a and 14b having the same structure. A drawback to the use of semiconductor device 10 in mixed-signal applications is the lack of reliability of high-voltage analog NMOS transistor 14a when operated continuously at a high voltage (10–15V) as required in most analog applications. The lack of reliability of NMOS transistor 14a is the result of hot-electron degradation caused by the shallow junctions and single impurity doping of its source/drain regions 30a and 30b and heavy doping of P well 21.

Figure 2:
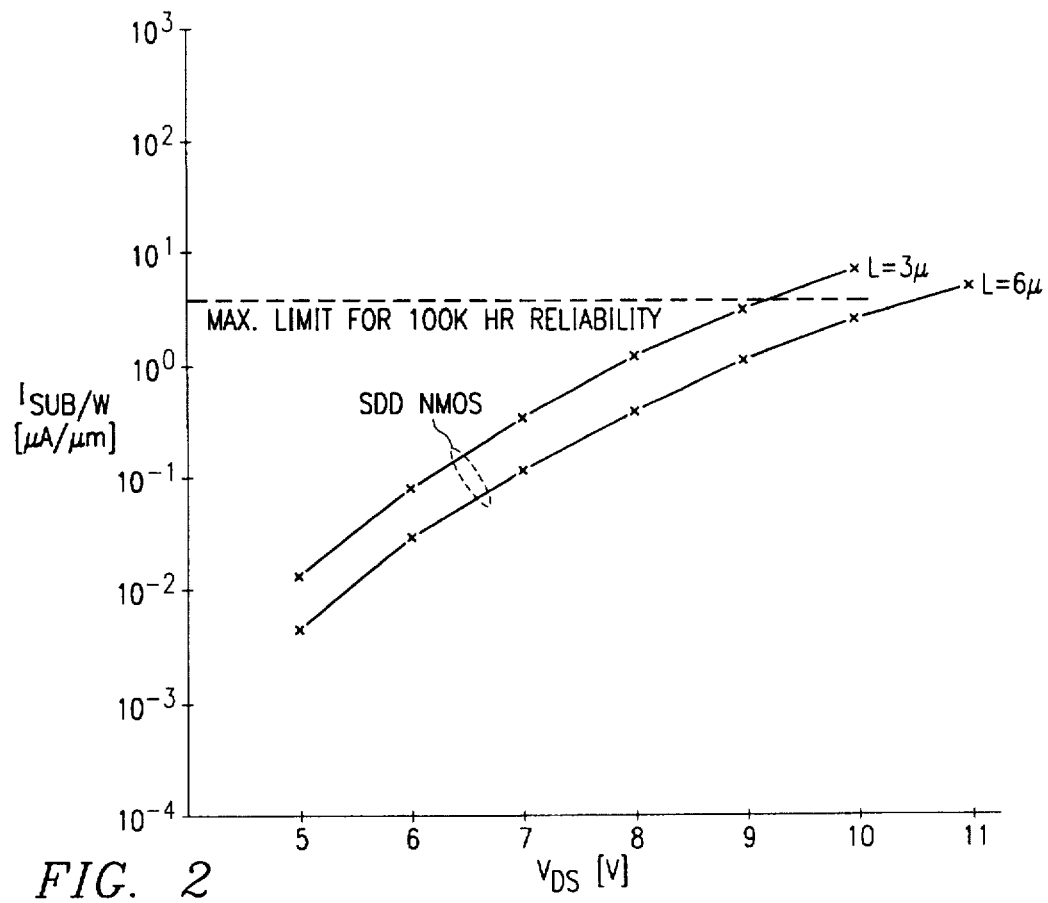
FIG. 2 is a graph showing substrate current as a function of $V_{DS}$ for an NMOS transistor, such as transistor 14a of FIG. 1.

FIG. 2 is a graph illustrating the relationship between substrate current normalized with respect to transistor width ($I_{SUB}$/W) and source-drain operating voltage ($V_{DS}$) for an SDD NMOS device, such as transistor 14a of FIG. 1. Substrate current is related to hot-electron degradation with increased substrate current indicating increased susceptibility to hot-electron degradation. As seen in FIG. 2, the maximum limit on substrate current to insure 100,000 hour reliability is about 5 µA/µM. For a channel length of 3 microns, operation of an SDD NMOS device, such as transistor 14a of FIG. 1, at only about 9.2V results in a substrate current that exceeds the maximum limit for 100,000 hour reliability. For a channel length of 6 microns, operation of an SDD NMOS device, such as transistor 14a of FIG. 1, at only about 10.3V results in a substrate current that exceeds the maximum limit for 100,000 hour reliability.

The results of FIG. 2 were obtained with a transistor having a P-well doping concentration in the range of only $2.0 \times 10^{15}$ atoms/cm$^3$, which is significantly lower than P-well concentrations normally used in digital processes. Normal P-well concentrations for digital processes are typically in the range of $3.0 \times 10^{16}$ atoms/cm$^3$ and devices built with these concentrations would exceed the maximum substrate current limit for 100,000 hour reliability at even lower operating voltages than those in FIG. 2.

Figure 3:
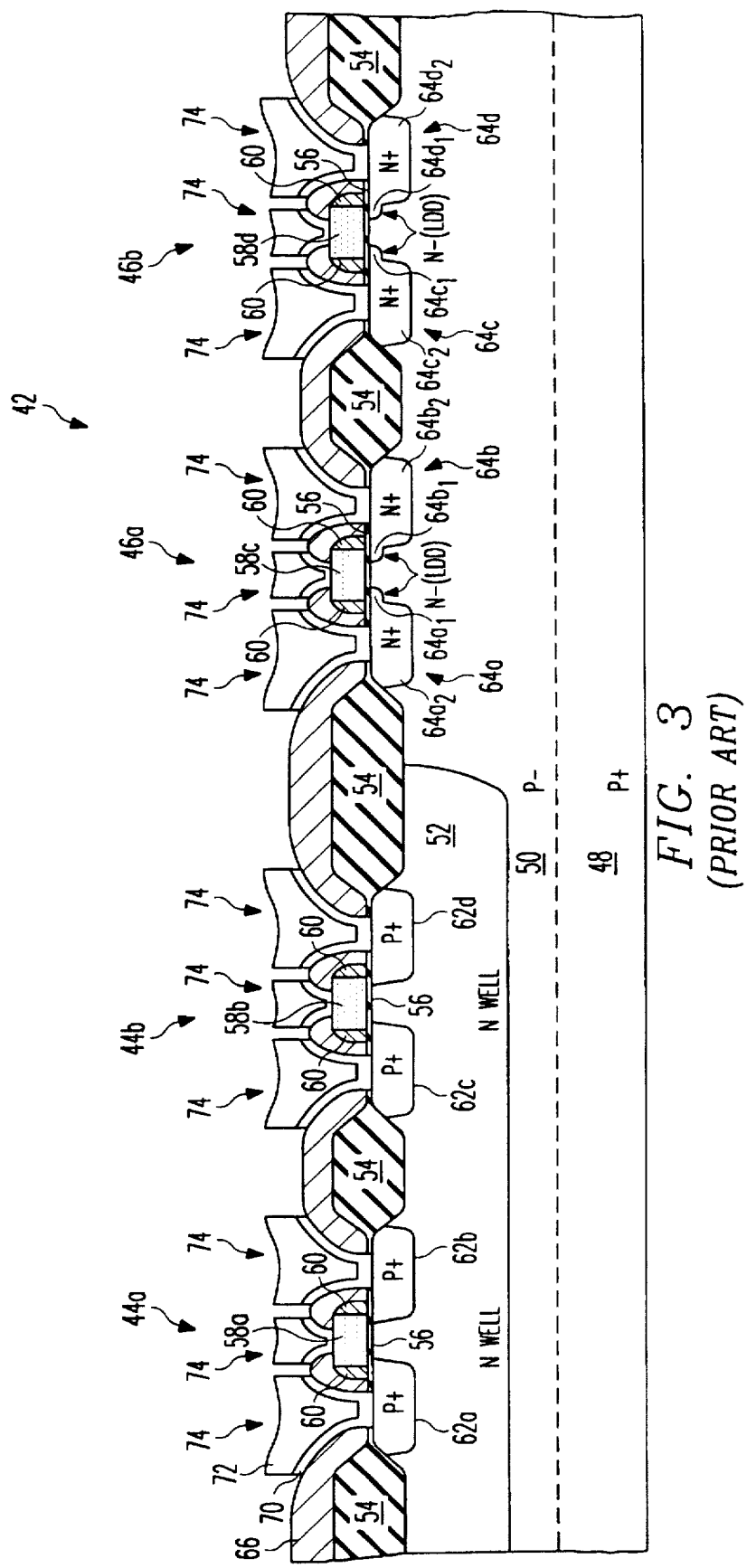
FIG. 3 is a cross-sectional elevation view of a mixed-signal CMOS device fabricated by an analog process according to the prior art.

FIG. 3 is a cross-sectional elevation view of a mixed-signal semiconductor device 42 according to the prior art fabricated by a conventional analog process. Semiconductor device 42 has a high-voltage CMOS transistor pair for analog applications that includes PMOS transistor 44a and NMOS transistor 46a and a low-voltage CMOS transistor pair for digital applications that includes PMOS transistor 44b and NMOS transistor 46b.

Semiconductor device 42 includes a P+ substrate 48 of silicon on which a P– epitaxial layer 50 is formed. N well 52 is formed in epitaxial layer 50. Field oxide regions 54 are formed at the surface of semiconductor device 42 spaced apart by gate oxide layer 56. PMOS transistor 44a includes a polysilicon gate 58a having oxide sidewall spacers 60 formed over gate oxide layer 56 and a pair of shallow, P+ single doped source/drain (SDD) regions 62a and 62b formed in N well 52 and self-aligned with sidewall spacers 60. PMOS transistor 44b includes a polysilicon gate 58b having oxide sidewall spacers 60 formed over gate oxide layer 56 and a pair of shallow, P+ single doped source/drain (SDD) regions 62c and 62d formed in N well 52 and self-aligned with associated sidewall spacers 60. NMOS transistor 46a includes a polysilicon gate 58c having oxide sidewall spacers 60 formed over gate oxide layer 56 and a pair of lightly doped source/drain (LDD) regions 64a and 64b formed in P– epitaxial layer 50. Source/drain regions 64a and 64b include lightly doped N– portions 64a$_1$ and 64b$_1$, respectively, that are self-aligned with gate 58c and heavily doped N+ portions 64a$_2$ and 64b$_2$, respectively, that are self-aligned with associated sidewall spacers 60. NMOS transistor 46b includes a polysilicon gate 58d having oxide sidewall spacers 60 formed over gate oxide layer 56 and a pair of lightly doped source/drain (LDD) regions 64c and 64d formed in P– epitaxial layer 54. Source/drain regions 64c and 64d include lightly doped N– portions 64c$_1$ and 64d$_1$, respectively, that are self-aligned with gate 58d and heavily doped N+ portions 64c$_2$ and 64d$_2$, respectively, that are self-aligned with associated sidewall spacers 60.

A doped glass layer (MLO) 66 is formed over field oxide regions 54, gate oxide layer 56, gates 58a–58d, and sidewall oxide spacers 60. Layer 66 is patterned and etched to form windows extending through layer 66 exposing contact areas on gates 58a–58d and through layer 66 and oxide layer 56 exposing contact areas on source/drain regions 62a–62d and 64a–64d. First and second metal layers 70 and 72, of TiW and Al-Si-Cu, respectively, are deposited over device 42 and patterned and etched to form contacts 74.

The conventional digital process used to form device 42 results in PMOS transistors 44a and 44b having the same structure and NMOS transistors 46a and 46b having the same structure. A drawback to the use of semiconductor device 42 in mixed-signal applications is the susceptibility of low-voltage digital transistors 44b and 46b to short-channel problems, such as punch-through breakdown, when channel length is scaled to less than 2 microns.

Figure 4:
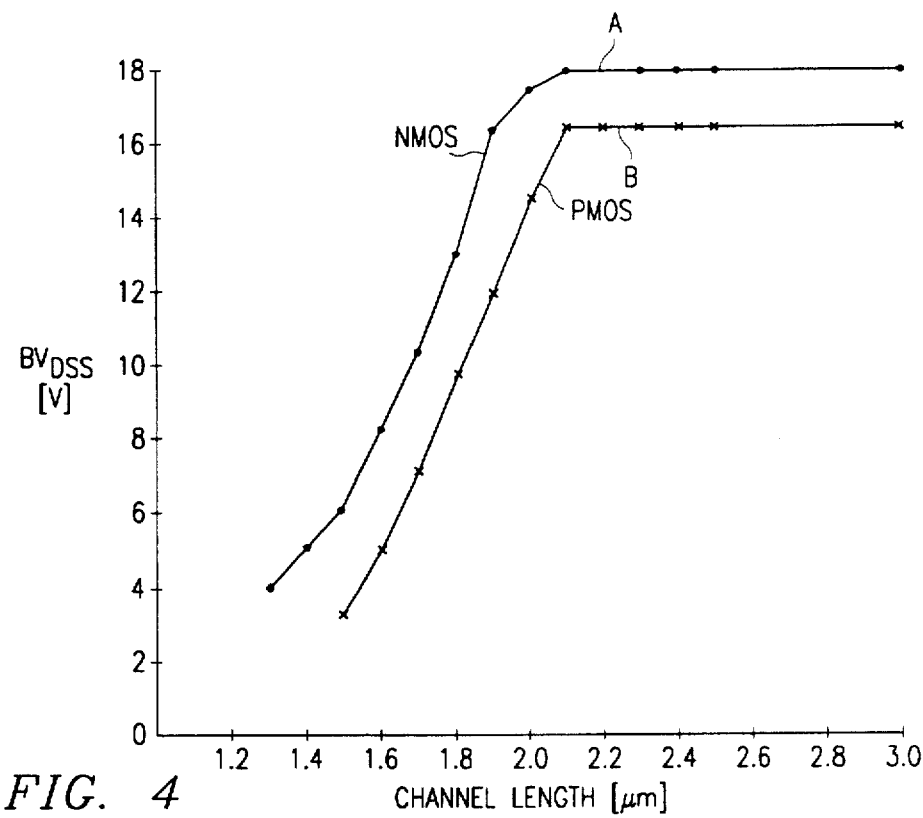
FIG. 4 is a graph showing breakdown voltage as a function of channel length for NMOS and PMOS transistors, such as transistors 44b and 46b of FIG. 3.

FIG. 4 is a graph illustrating the relationship between breakdown voltage ($BV_{DSS}$) and channel length for NMOS transistor 46b and PMOS transistor 44b in curves A and B, respectively. As seen in FIG. 4, breakdown voltages decrease very rapidly when channel lengths for both NMOS transistor 46b and PMOS transistor 44b are scaled to less than 2 microns.

Figure 5:
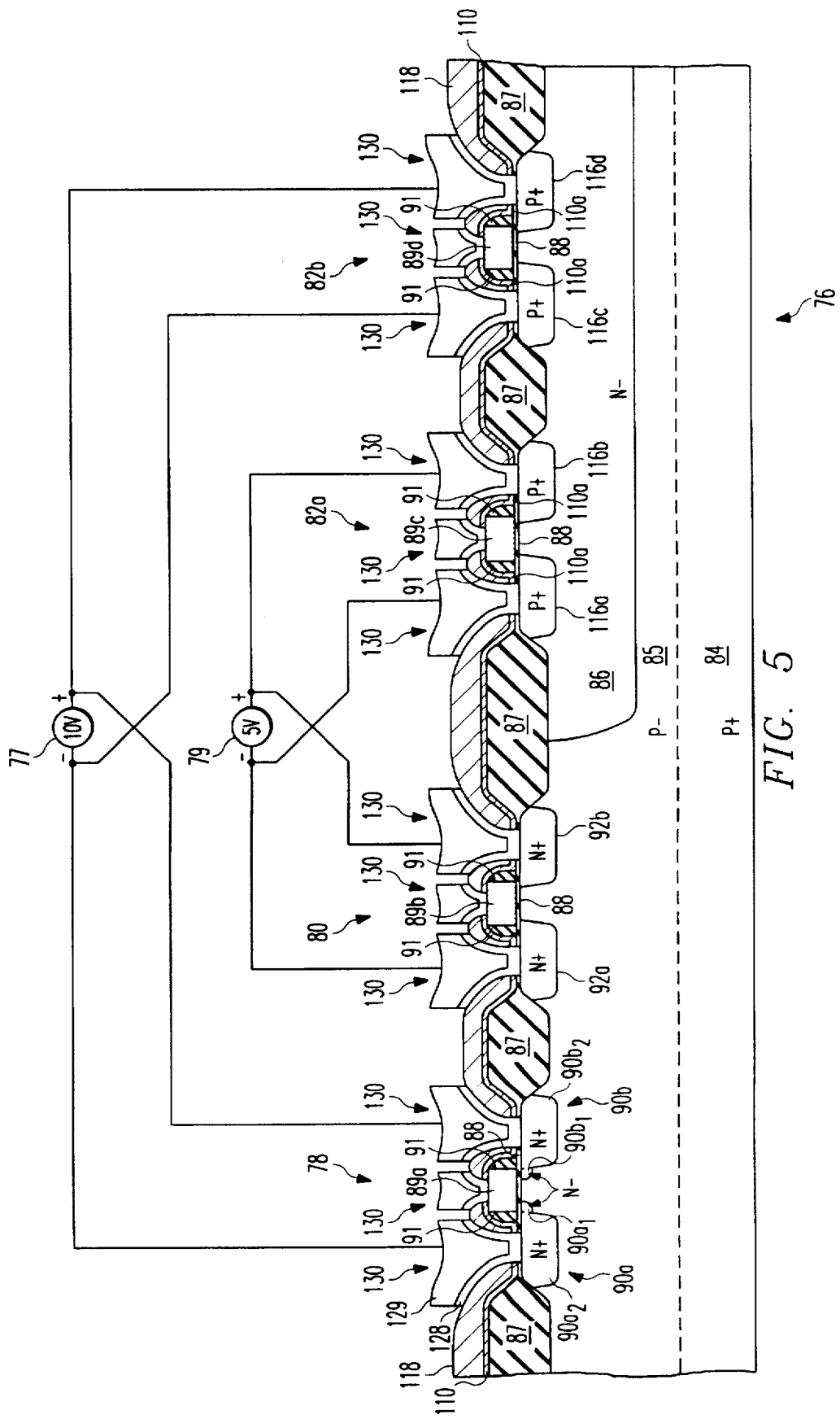
FIG. 5 is a cross-sectional elevation view of a semiconductor device according to a first embodiment of the invention.

FIG. 5 is a cross-sectional elevation view of a portion of a semiconductor device 76 according to a first embodiment of the invention. Semiconductor device 76 is a mixed-signal device having a high-voltage CMOS circuit portion that may perform an analog function and a low-voltage CMOS circuit portion that may perform a digital function. Semiconductor device 76 includes NMOS transistors 78 and 80 and PMOS transistors 82a and 82b.

NMOS transistor 78 and PMOS transistor 82b are in the high-voltage analog CMOS circuit portion of device 76. Although not illustrated, it is understood that the high-voltage CMOS circuit portion of device 76 may contain numerous other NMOS and PMOS transistors that have the same structure as transistors 78 and 82b and are interconnected so as to perform, for example, a desired analog function.

NMOS transistor 80 and PMOS transistor 82a are in the low-voltage CMOS circuit portion of device 76. Although not illustrated, it is understood that the low-voltage CMOS circuit portion of device 76 may also contain numerous other NMOS and PMOS transistors that have the same structure as transistors 80 and 82a and are interconnected so as to perform, for example, a desired digital function.

Semiconductor device 76 includes a heavily doped P+ substrate 84 of silicon, for example, on which a lightly doped P− epitaxial layer 85 is formed. A lightly doped N− well 86 is formed in epitaxial layer 85. Thick field oxide regions 87 are formed at the face of epitaxial layer 85 to electrically isolate adjacent ones of transistors 78, 80, 82a, and 82b. Gate oxide layer 88 is also formed at the face of epitaxial layer 85 between adjacent thick field oxide regions 87. Transistors 78, 80, 82a, and 82b includes conductive gates 89a–89d, respectively, of polysilicon, for example, formed over gate oxide layer 88. Sidewall spacers 91, of an insulator such as oxide, for example, are formed on the sidewalls of gates 89a–89d. A thin insulator layer 110, of oxide, for example, is formed over field oxide regions 87, gate oxide layer 88, gates 89a–89d, and sidewall spacers 91. Layer 110 includes sidewall spacer extension regions 110a formed over sidewall spacers 91. Layer 110 is conformal so that its thickness normal to any surface is approximately constant. Sidewall spacer extension regions 110a thus have the impact of widening the sidewall spacers 91 by the thickness of layer 110.

High-voltage NMOS transistor 78 includes a pair of lightly-doped source/drain (LDD) regions 90a and 90b formed in epitaxial layer 85. Source/drain regions 90a and 90b include lightly doped N− portions $90a_1$ and $90b_1$, respectively, that self-aligned with gate 89a of transistor 78 and heavily doped N+ portions $90a_2$ and $90b_2$, respectively, that are self-aligned with associated sidewall spacers 91.

Low-voltage transistor 80 includes a pair of N+ single-doped source/drain (SDD) regions 92a and 92b formed in epitaxial layer 85. Each of source/drain regions 92a and 92b is self-aligned with an associated sidewall spacer 91.

Low-voltage transistor 82a includes a pair of P+ source/drain regions 116a and 116b formed in N− well 86. Each of source/drain regions 116a and 116b is self-aligned with an associated sidewall spacer extension region 110a of oxide layer 110.

High-voltage PMOS transistor 82b includes a pair of P+ source/drain regions 116c and 116d formed in N− well 86. Each of source/drain regions 116c and 116d is self-aligned with an associated sidewall spacer extension region 110a of oxide layer 110.

Contacts 130, formed from first and second metal layers 128 and 129, of TiW and Al-Si-Cu, respectively, extend through a doped glass layer (MLO) 118 to contact gates 89a–89d and source/drain regions 90a, 90b, 92a, 92b, and 116a–116d. High-voltage transistors 78 and 82b are biased to a high source-drain operating voltage (10 volts, for example) by high voltage source 77 which is electrically connected across source/drain regions 90a and 90b and across source/drain regions 116c and 116d by way of associated contacts 130. Low-voltage transistors 80 and 82a are biased to a low source-drain operating voltage (5 volts, for example) by a low voltage source 79 which is electrically connected across source/drain regions 92a and 92b and across source/drain regions 116a and 116b by way of associated contacts 130.

Figure 6:
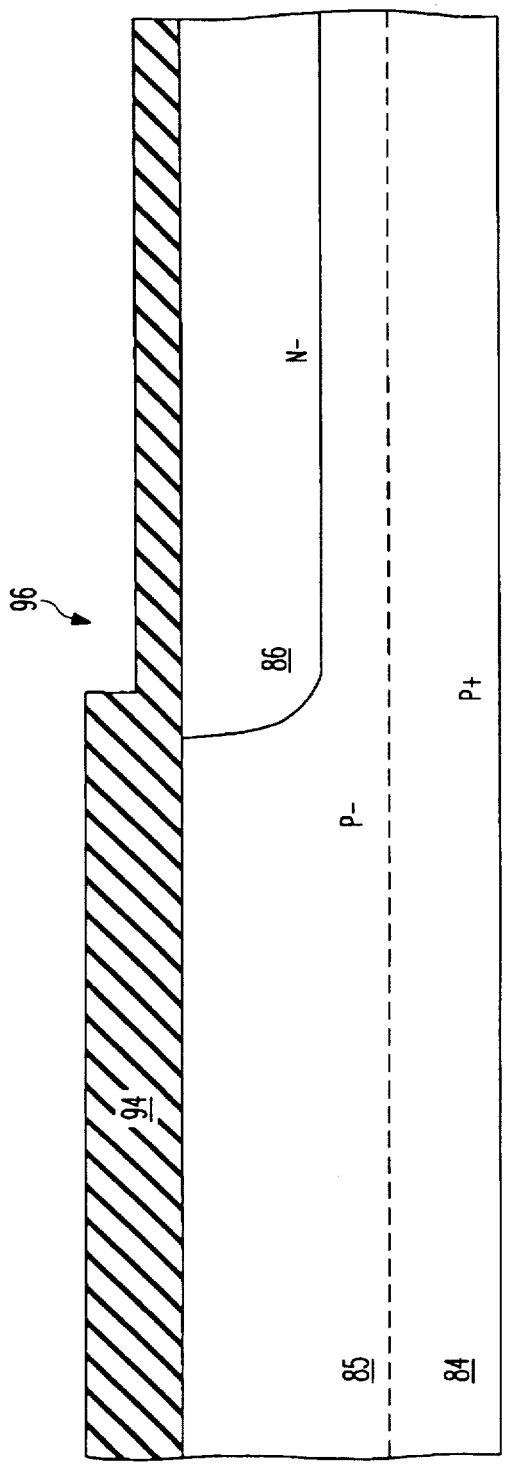
FIGS. 6–12 are cross-sectional elevation views of the semiconductor device of FIG. 5 at successive stages during fabrication.
Figure 7:
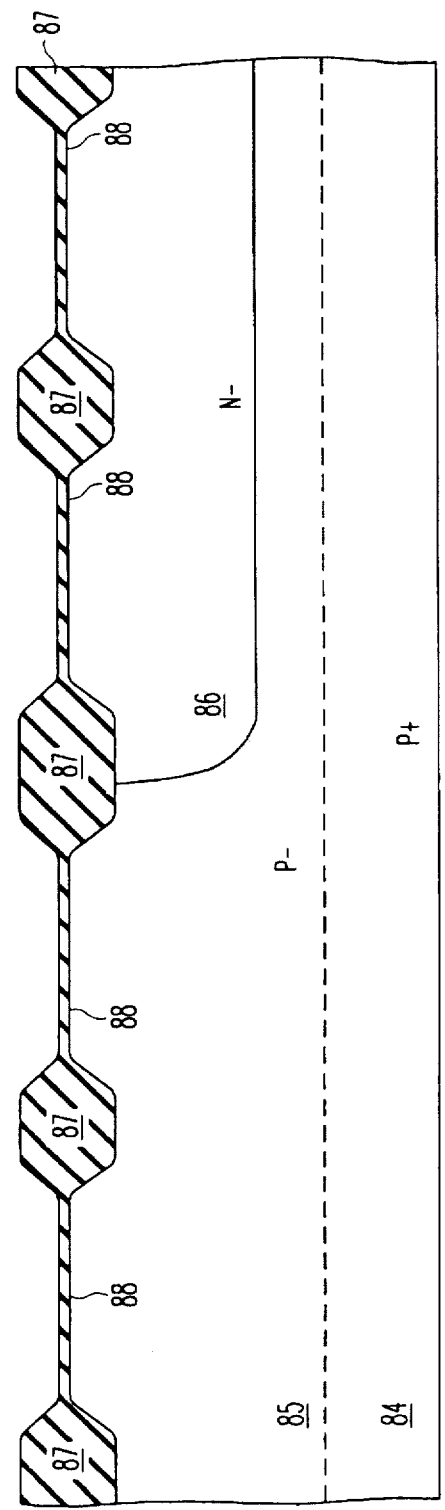
Figure 8:
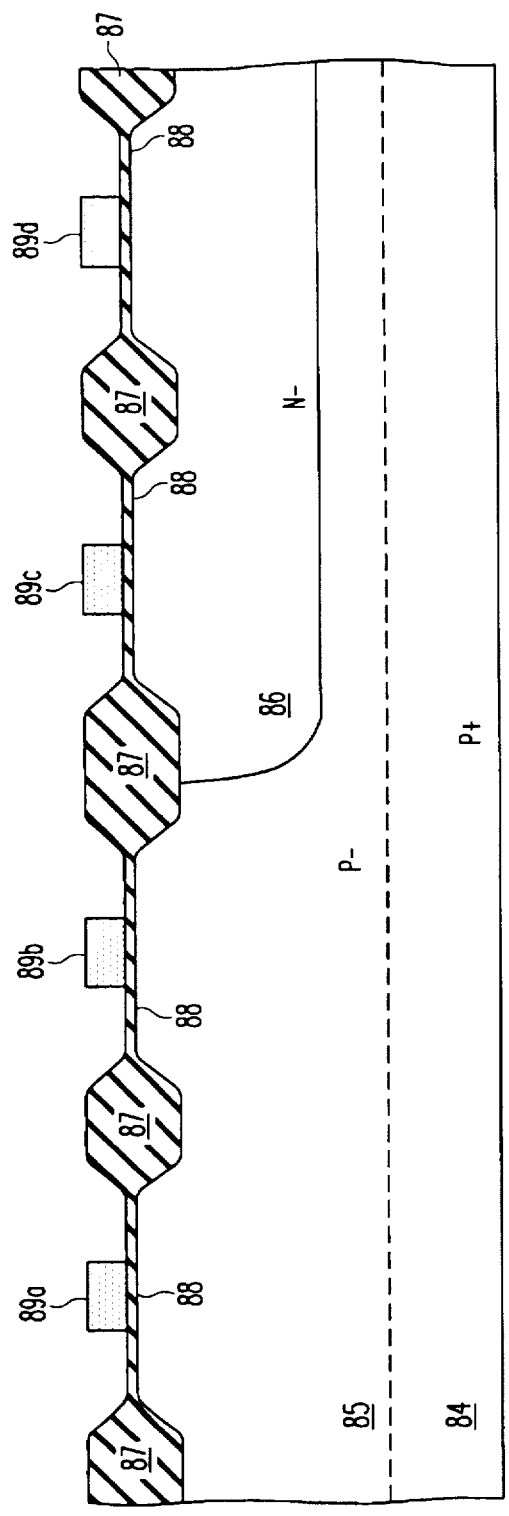
Figure 9:
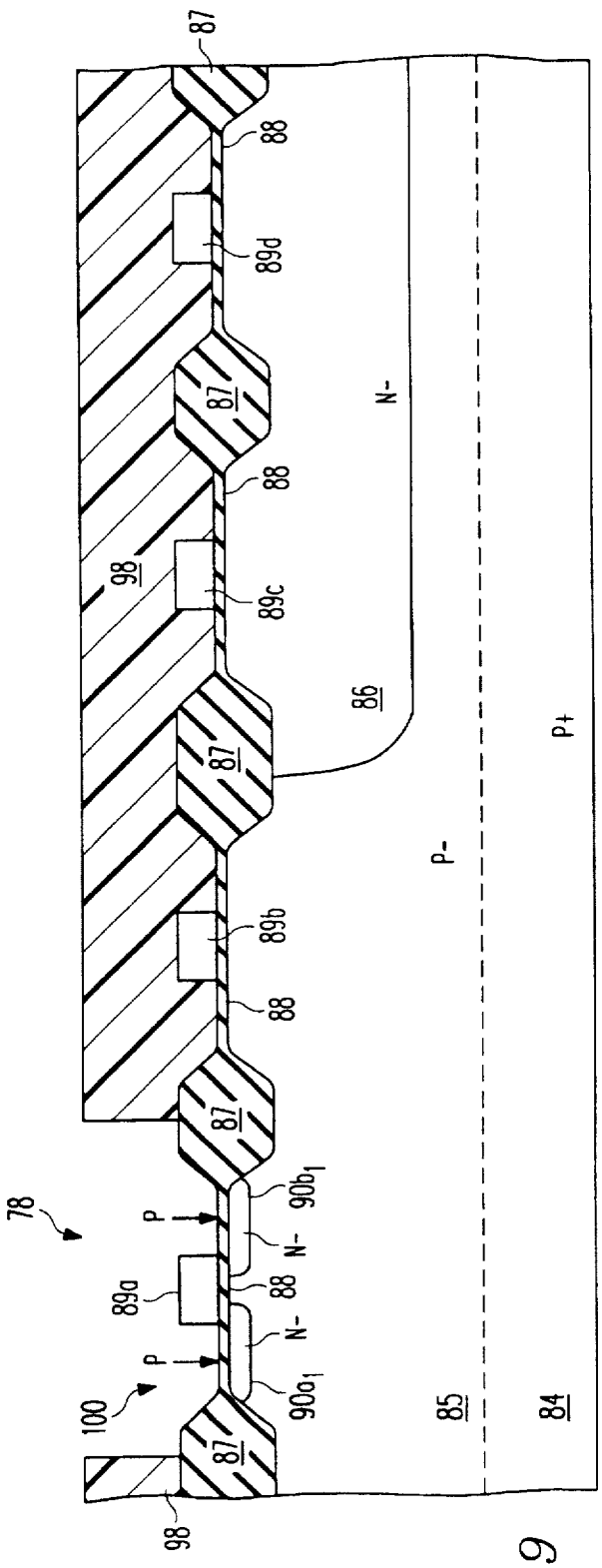
Figure 10:
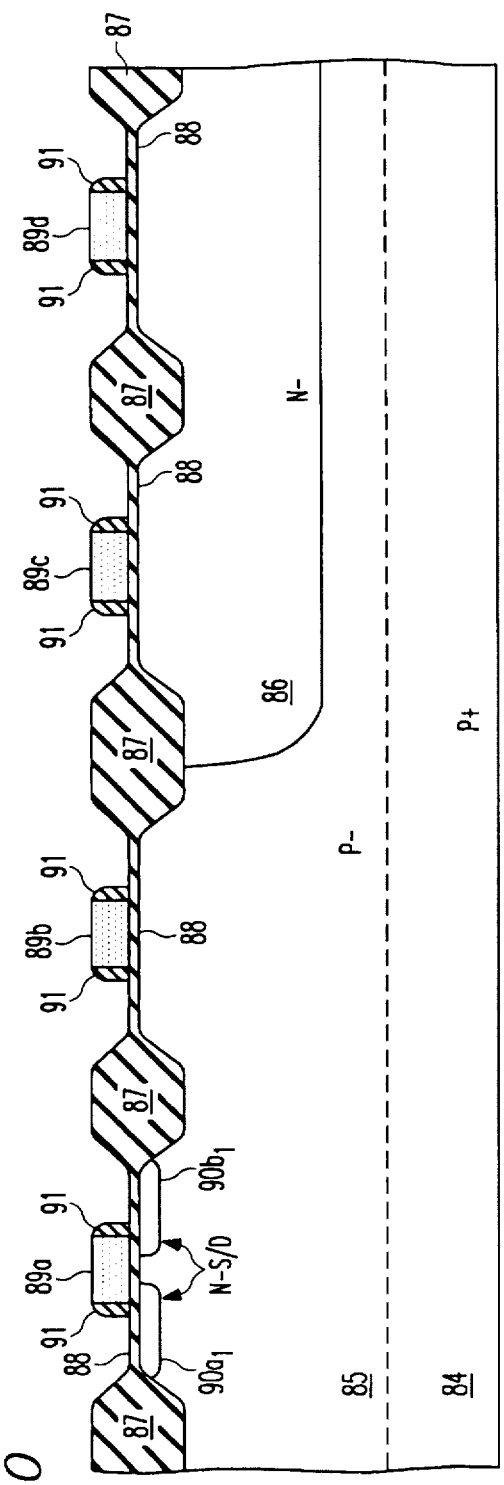

Successive stages in a method of fabricating semiconductor device 76 of FIG. 5 are shown in FIGS. 6–12. Referring to FIG. 6, fabrication of device 76 begins with the formation of P− epitaxial layer 85 on P+ substrate 84. P+ substrate 84 has a thickness of about 625 microns and resistivity of about 0.015 Ω-cm. P− epitaxial layer 85 has a thickness of about 20 microns and resistivity of about 6–8 Ω-cm. An oxide layer 94 is formed over P− epitaxial layer 85 and patterned and etched to form a window exposing the surface of epitaxial layer 85 at area 96. A dopant, such as phosphorus, is then implanted with a dose of 3.7E12 atoms/cm² at 150 keV in P− epitaxial layer 85 through the window at area 96 to form N well 86. During the diffusion of N well 86, the oxide layer 94 grows in the window to form a recessed oxide region at area 96 resulting in the structure shown in FIG. 6.

Oxide layer 94 is then removed and a pad oxide layer (not shown) having a thickness of about 500 Angstroms is formed over P− epitaxial layer 85 and N well 86. A nitride layer (not shown) having a thickness of about 1400 Angstroms is formed over the pad oxide layer followed by formation of a first photoresist layer (not shown) over the nitride layer. The nitride and first photoresist layers are patterned and etched using photolithographic techniques to expose areas between moat regions. Conventional Boron and Phosphorous channel stop implants (not shown) may optionally be performed at this point. Thick field oxide regions 87 are then thermally grown to a thickness of about 12000 Angstroms in the exposed areas. The remaining portions of the nitride layer and pad oxide layer are then removed by etching. A gate oxide layer 88 is then thermally grown over the face of epitaxial layer 85 and N− well 86 between field oxide regions 87 to a thickness of about 425 Angstroms resulting in the structure of FIG. 7.

A polysilicon layer having a thickness of about 5000 Angstroms is then deposited over gate oxide layer 88 and field oxide regions 87 and doped with an impurity, such as phosphorus, to render it conductive (about 20Ω per square). The polysilicon layer is patterned and etched to form gates 89a–89d resulting in the structure shown in FIG. 8.

A layer of photoresist 98 is then formed on the surface of the wafer and patterned to form a window 100 exposing gate 89a and adjacent portions of gate oxide layer 88 in the high-voltage NMOS portion of device 76 for source/drain implantation. An impurity, such as phosphorus, is then unplanted in P– epitaxial layer 85 with a dose of 2.6E13 atoms/cm$^2$ at 150 keV through window 100 to form N– source/drain regions 90a$_1$ and 90b$_1$ of transistor 78 that are self-aligned with the exposed gate 89a resulting in the structure shown in FIG. 9. Photoresist layer 98 blocks the N– implant from the low-voltage NMOS portion of device 76 in which transistor 80 will be fabricated.

Photoresist layer 98 is then removed and a conformal oxide layer (not shown) is deposited over the wafer using low pressure chemical vapor deposition, for example, with a thickness of about 0.30 microns. The conformal oxide layer is then anisotropically etched using reactive ion etching or plasma etching techniques leaving oxide sidewall spacers 91 on the near-vertical edges of gates 89a–89d resulting in the structure of FIG. 10. The width of sidewall spacers 91 is approximately 0.30 microns, the thickness of conformal oxide layer from which they are etched.

A new layer of photoresist 106 is then formed on the surface of the wafer and patterned to form a window 108 exposing areas in which N+ source/drain implants are desired. An impurity, such as arsenic, is then implanted in P– epitaxial layer 85 with a dose of 8.0E15 atoms/cm$^2$ at 135 keV through window 108 to form a pair of N+ source/drain regions 92a and 92b for NMOS transistor 80 and a pair of N+ regions 90a$_2$ and 90b$_2$ for NMOS transistor 78. N+ source/drain regions 92a and 92b and N+ regions 90a$_2$ and 90b$_2$ are self-aligned with associated sidewall spacers 91. An anneal is then performed to activate the implant and drive the junction to a depth of about 0.45 microns resulting in the structure shown in FIG. 11.

Figure 11:
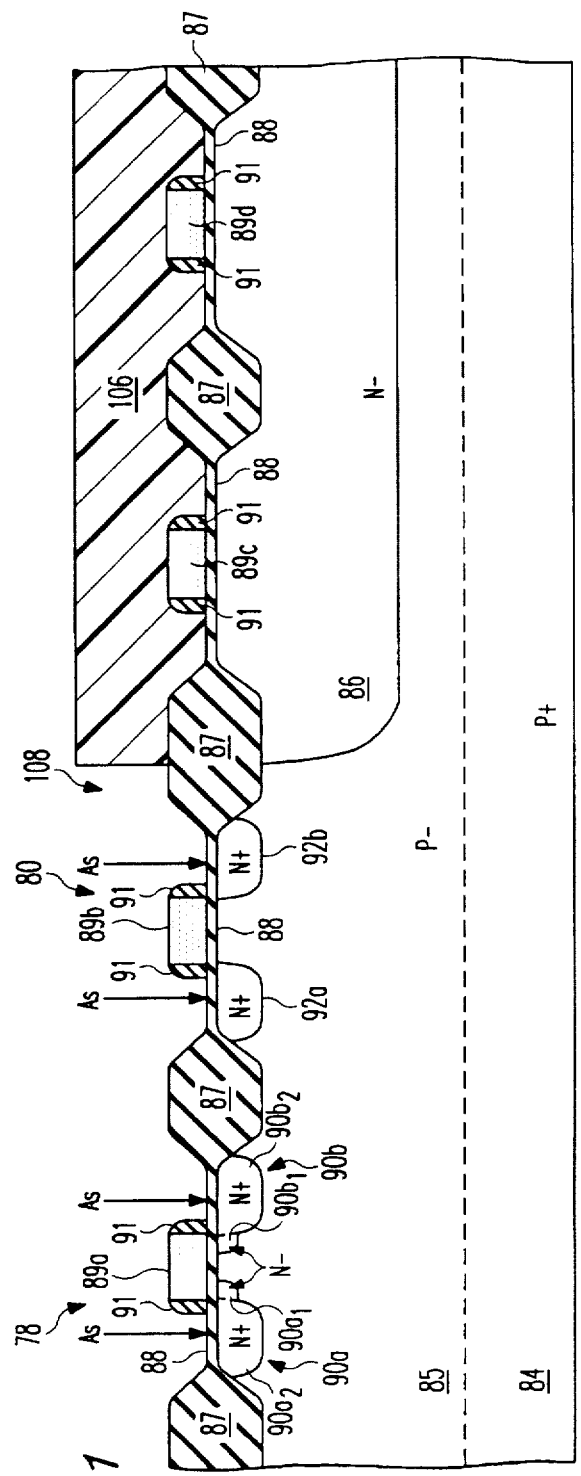
Figure 12:
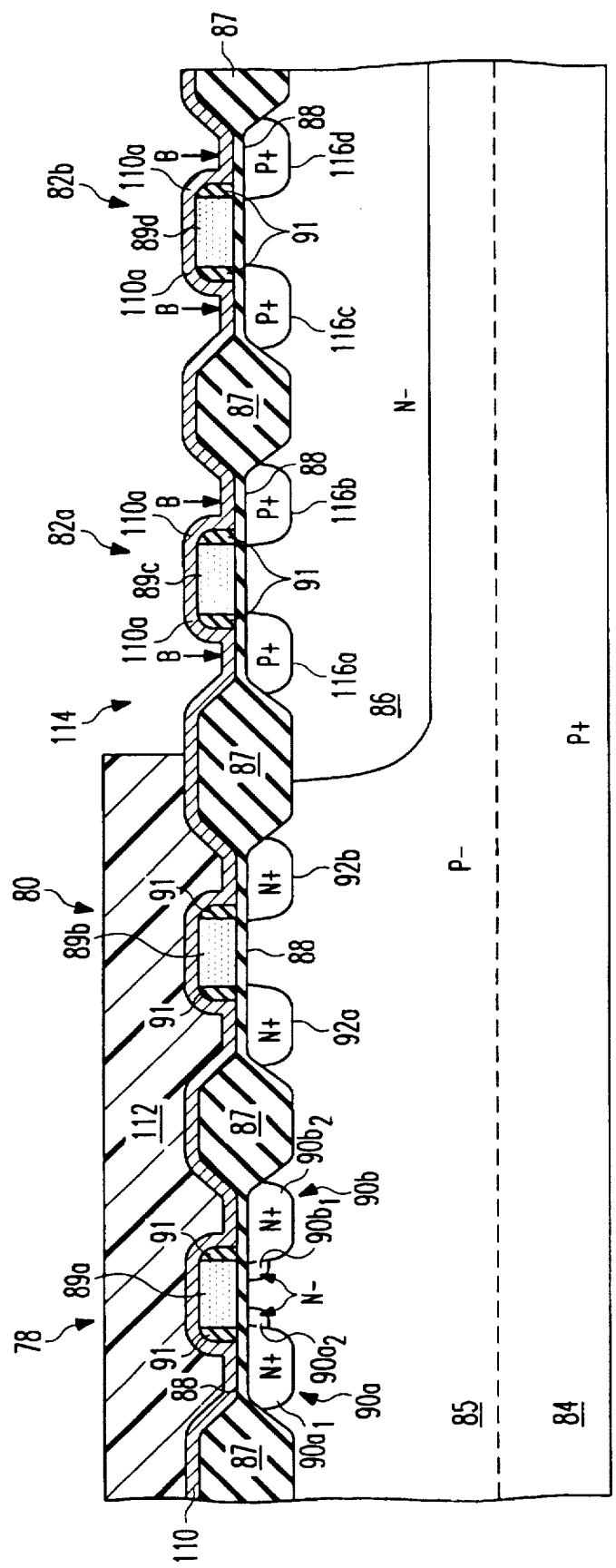

As seen in FIG. 11, high-voltage NMOS transistor 78 is an LDD NMOS transistor having a pair of lightly doped source/drain (LDD) regions 90a and 90b having lightly doped portions 90a$_1$ and 90b$_1$, respectively, and heavily doped portions 90a$_2$ and 90b$_2$, respectively. Low-voltage NMOS transistor 80 is an SDD NMOS transistor having a pair of single doped source/drain (SDD) regions 92a and 92b. Since the implant that forms source/drain regions 92a and 92b is offset from the edges of gate 89b by sidewall spacers 91, the negative impact on channel length due to lateral out-diffusion of the source/drain regions for transistor 80 is reduced with respect to the negative impact on channel length that would result if transistor 80 were an LDD NMOS transistor having N– implants self-aligned with the edges of gate 89b. Thus, while the width of the gate defines the initial length of the channel region of an LDD NMOS transistor, such as high-voltage LDD NMOS transistor 78, the initial length of the channel region of low-voltage SDD NMOS transistor 80 is defined by the width of gate 89b plus the width of two sidewall spacers 91. Since sidewall spacers 91 have a width of about 0.3 microns, forming transistor 80 as an SDD transistor provides an effective initial channel length increase of about 0.6 microns over initial channel length if transistor 80 were formed as an LDD transistor.

Photoresist layer 106 is then removed and a insulator layer 110, of LPCVD oxide, for example, is then deposited on the surface of the wafer to a thickness of approximately 0.15 micrometers. Layer 110 is conformal so that its thickness normal to any surface is approximately constant. Layer 110 includes sidewall spacer extension regions 110a that are formed over sidewall spacers. Since layer 110 is conformal, sidewall spacer extension regions 110a effectively widen sidewall spacers 91 by the thickness of layer 110. A layer of photoresist 112 is then formed on layer 110 and patterned to form a window 114 exposing areas in which P+ implants are desired. An impurity, such as boron, is then implanted in N– well 86 with a dose of 4.0E15 atoms/cm$^2$ at 40 keV through the window 114 to form a pair of P+ source/drain regions 116a and 116b for PMOS transistor 82a and a pair of P+ source/drain regions 116c and 116d for PMOS transistor 82b and resulting in the structure shown in FIG. 12. The P+ implant penetrates layer 110 except at [add-on] sidewall spacer extension regions 110a where the thickness of layer 110 normal to gate oxide layer 88 is essentially equal to the thickness of gates 89a–89d due to the fact that it covers sidewall spacers 91. As a result, sidewall spacer extension regions 110a block the P+ implant so that source/drain regions 116a–116d are self-aligned with associated sidewall spacer extension regions 110a. The initial channel length (i.e. channel length prior to lateral out-diffusion of the P+ source/drain regions) of each of PMOS transistors 82a and 82b is thus equal to the width of its respective gate (89c or 89d) plus the width of its respective two sidewall spacers 91 plus the width of its respective two sidewall spacer extension regions 110a. Since sidewall spacer extension regions 110a have a width equal to the thickness of layer 110 (i.e. approximately 0.15 micrometers), the initial channel length of PMOS transistors 82a and 82b is about 0.3 microns greater than that of PMOS transistors, such as transistors 44a and 44b of FIG. 3, formed using a conventional sidewall spacer process. Although some of the additional increase in initial channel length is lost due to the increased implant energy used to implant the P+ impurity through layer 110 causing increased lateral out-diffusion or scattering of the P+ source/drain regions 116, a net improvement in effective channel length (i.e. initial channel length less lateral out-diffusion) is achieved with sidewall spacer extension regions 110a resulting in improved short-channel behavior as will be described with respect to FIG. 15.

Fabrication of PMOS transistors 82a and 82b by performing the P+ implant after formation of layer 110 is possible due to the fact that the relatively high implant range and diffusivity of P type impurities, such as boron, results in the lateral out-diffusion of source/drain regions 116a–116d extending under gates 89c and 89d thus completing transistor formation. Since the implant range and diffusivity of N type impurities, such as arsenic, is relatively low, the N+ implant is performed prior to formation of layer 110 so that the lateral out-diffusion of N+ source/drain regions 92a and 92b is sufficient to ex-tend under gate 89b and complete formation of NMOS transistor 80. Performing the N+ implant subsequent to formation of layer 110 would result in incomplete formation of transistor 80 since the lateral out-diffusion of N+ source/drain regions 92a and 92b would not overcome the additional offset provided by sidewall spacer extension regions 110a. As a result, N+ source/drain regions 92a and 92b would not extend under gate 89b and would be electrically disconnected from the inversion region beneath gate 89b.

Photoresist layer 112 is then removed and a doped glass layer (MLO) 118 having a thickness of about 10000 Angstroms is then formed on the surface of the wafer and patterned and etched to form windows extending through layer 110 to expose contact areas on gates 89a–89d and through layer 110 and gate oxide layer 88 to expose contact areas on N+ source/drain regions 90a, 90b, 92a, and 92b and P+ source/drain regions 116a–116d.

Contacts are then formed by depositing a first metal layer 128 of TiW having a thickness of about 2000 Angstroms over the wafer and then depositing a second metal layer 129 of Al-Si-Cu having a thickness of about 7500 Angstroms over the first metal layer 128. The first and second metal layers 128 and 129 are then patterned and etched to form contacts 130 for contacting the gates 89a–89d and source/ drain regions 90a, 90b, 92a, 92b, and 116a–116d of NMOS transistors 78 and 80 and PMOS transistors 82a and 82b. This results in the structure shown in FIG. 5.

Figure 13:
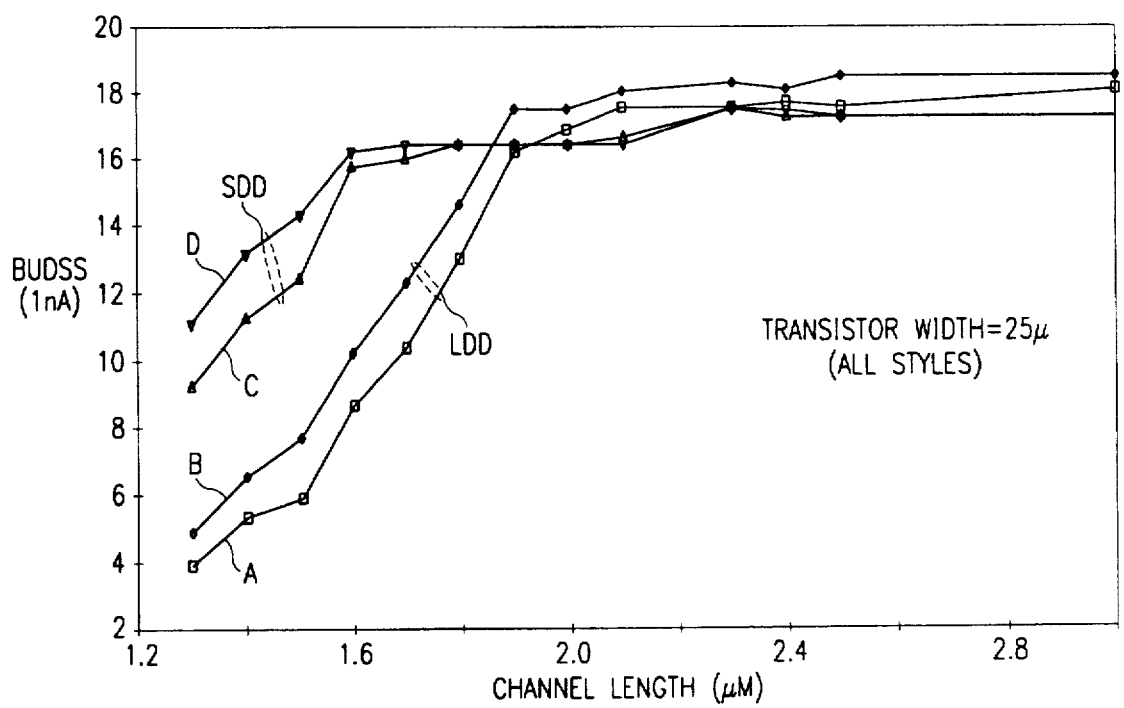
FIG. 13 is a graph showing breakdown voltage as a function of channel length for SDD NMOS transistors, such as transistor 80 of FIG. 5, and LDD NMOS transistors, such as transistor 46b of FIG. 3.

FIG. 13 is a graph illustrating the relationship between breakdown voltage ($BV_{DSS}$) and channel length for LDD NMOS transistors, such as transistor 46b of FIG. 3, and SDD NMOS transistors, such as low-voltage transistor 80 of FIG. 5. Measurements taken for a pair of NMOS transistors having LDD source/drain regions are shown in curves A and B. Measurements taken for a pair of NMOS transistors having SDD source/drain regions are shown in curves C and D.

As seen in curves A and B of FIG. 13, breakdown voltages for LDD NMOS transistors, such as transistor 46b, are approximately constant for channel lengths down to about 2 µM and decrease rapidly for smaller channel lengths. On the other hand, as seen in curves C and D, breakdown voltages for SDD NMOS transistors, such as transistor 80, are approximately constant for channel lengths down to about 1.6 µM and decrease rapidly for smaller channel lengths. As FIG. 13 illustrates, SDD NMOS transistors, such as transistor 80, are clearly superior to LDD NMOS transistors, such as transistor 46B, in terms of punch-through prevention. The use of SDD NMOS transistors, such as transistor 80, in the low-voltage CMOS portion of mixed signal device 76 advantageously permits the channel lengths of low-voltage NMOS transistors to be scaled to less than 2 microns, a significant improvement over minimum channel lengths possible with LDD NMOS transistors.

Figure 14:
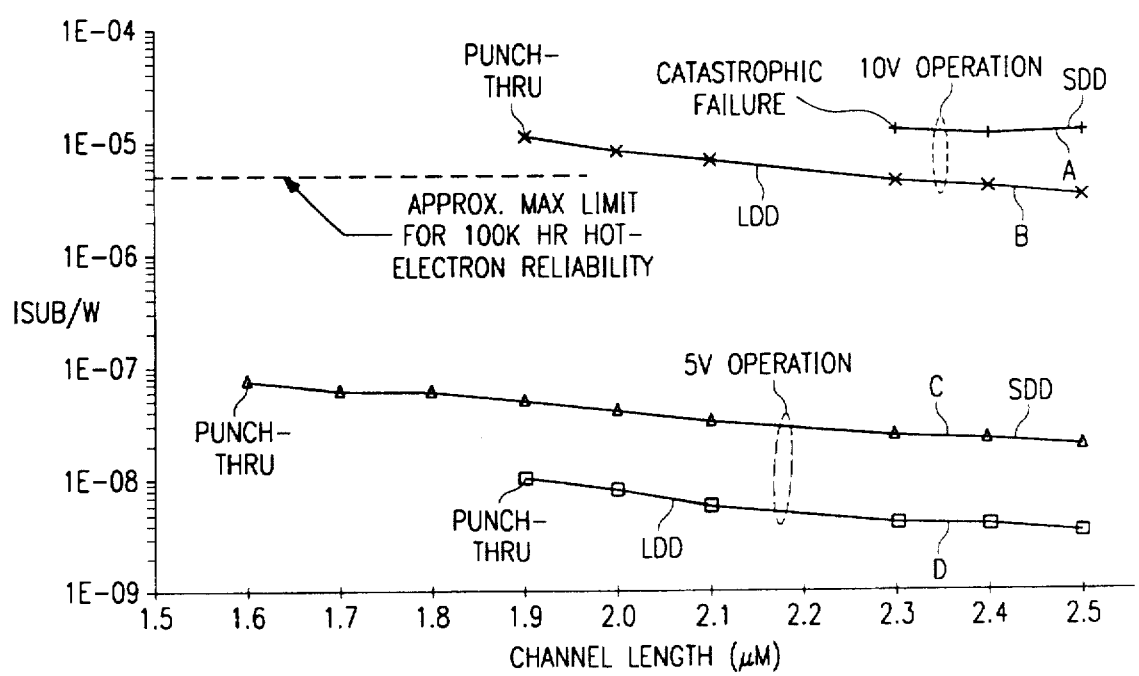
FIG. 14 is a graph showing substrate current as a function of channel length for SDD NMOS transistors, such as transistor 80 of FIG. 5, and LDD NMOS transistors, such as transistor 78 of FIG. 5.

FIG. 14 is a graph illustrating the relationship between substrate current normalized with respect to transistor width ($I_{SUB}/W$) and channel length for SDD and LDD NMOS transistors fabricated according to the method described with respect to FIGS. 5–12. Substrate current is related to hot-electron degradation with increased substrate current indicating increased susceptibility to hot-electron degradation. As seen in FIG. 14, the maximum limit on substrate current to insure 100,000 hour reliability is about 5 µA/µM.

Measurements taken for an SDD NMOS transistor, such as transistor 80 of FIG. 5, and an LDD NMOS transistor, such as transistor 78 of FIG. 5, operated at the 10 volt analog level are shown in FIG. 14 by curves A and B, respectively. While substrate current for an SDD NMOS transistor operated at 10 volts exceeds the maximum limit to insure 100,000 hour reliability as shown by curve A, substrate current for an LDD NMOS transistor is less than the maximum limit for channel lengths down to about 2.1 microns. LDD NMOS transistors, such as transistor 78, thus provide reliable operation in the high-voltage CMOS portion of mixed signal device 76.

Measurements taken for an SDD NMOS transistor, such as transistor 80 of FIG. 5, and an LDD NMOS transistor, such as transistor 78 of FIG. 5, operated at the 5 volt digital level are shown in FIG. 14 by curves C and D, respectively. Although the LDD NMOS transistor (curve D) exhibits slightly better substrate current behavior, the SDD NMOS transistor (curve C) is well within the safe operating area even down to the punch-through limits of the transistor. The use of SDD NMOS transistors, such as transistor 80, in the low-voltage CMOS portion of mixed signal device 76 thus results in reliable operation at digital voltage levels as demonstrated by curve C of FIG. 14 while permitting channel lengths to be scaled to less than 2 microns as demonstrated by curves C and D of FIG. 13.

Figure 15:
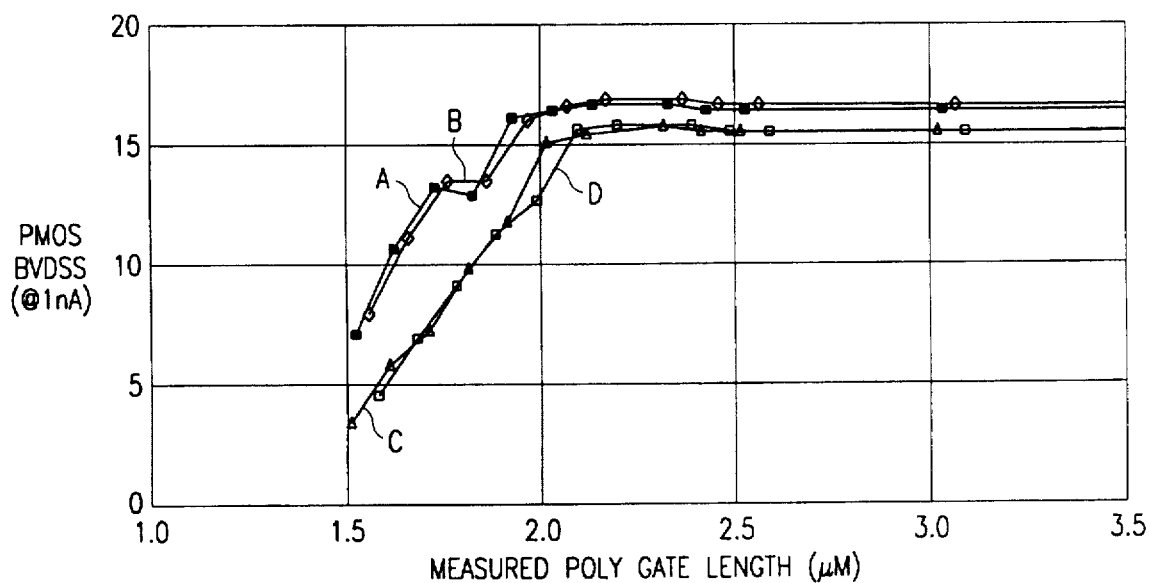
FIG. 15 is a graph showing breakdown voltage (BVDSS) as a function of measured gate length for PMOS transistors, such as transistor 82a of FIG. 5 and transistor 44b of FIG. 3.

FIG. 15 is a graph illustrating the relationship between breakdown voltage ($BV_{DSS}$) and measured poly gate length for several PMOS devices having both sidewall spacers 91 and sidewall spacer extension regions 110a fabricated according to the method described above with respect to FIGS. 5–12, such as transistor 82a of FIG. 5, (curves A and B) and for several prior art PMOS devices, such as transistor 44b of FIG. 3, having only sidewall spacers 60 (curves C and D). As seen in curves C and D, the onset of punch-through for PMOS transistors having only sidewall spacers occurs at a channel length of about 2.1 microns while the onset of punch-through for PMOS transistors having both sidewall spacers and sidewall spacer extension regions 110a occurs at a channel length of about 1.8 microns. The use of the sidewall spacer extension regions 110a thus delays the onset of punch-through by almost 0.3 µM permitting the low-voltage PMOS transistors to have channel lengths scaled to less than 2 microns.

It is an advantage of the invention, as illustrated by FIGS. 13 and 14, that the high-voltage CMOS portion of semiconductor device 76 includes LDD NMOS transistors, such as transistor 78, that are capable of operating continuously at high analog voltage levels while the low-voltage CMOS portion of semiconductor device 76 includes SDD NMOS transistors, such as transistor 80, that operate reliably at digital voltage levels and are capable of being scaled to channel lengths of less than 2 microns. The advantage of being able to form the formation of LDD NMOS transistors in the high-voltage CMOS portion and SDD NMOS transistors in the low-voltage portion of semiconductor device 76 is achieved without incurring any additional process steps, as illustrated by FIGS. 5–12.

It is an additional advantage of the invention, as illustrated by FIG. 15, that the PMOS transistors of semiconductor device 76 utilize sidewall spacer extension regions 110a to their improve short-channel behavior. The improvement in short-channel behavior resulting from the use of sidewall spacer extension regions 110a permits the low-voltage PMOS transistors, such as transistor 82a, to be scaled to channel lengths of less than 2 microns. The invention achieves the advantage provided by sidewall spacer extension regions 110a at the cost of only one additional process step, the formation of insulator layer 110. In addition, since layer 110 is deposited after formation of source/drain regions 90a, 90b, 92a, and 92b of NMOS transistors 78 and 80, it does not impact performance of the NMOS transistors.

Figure 16:
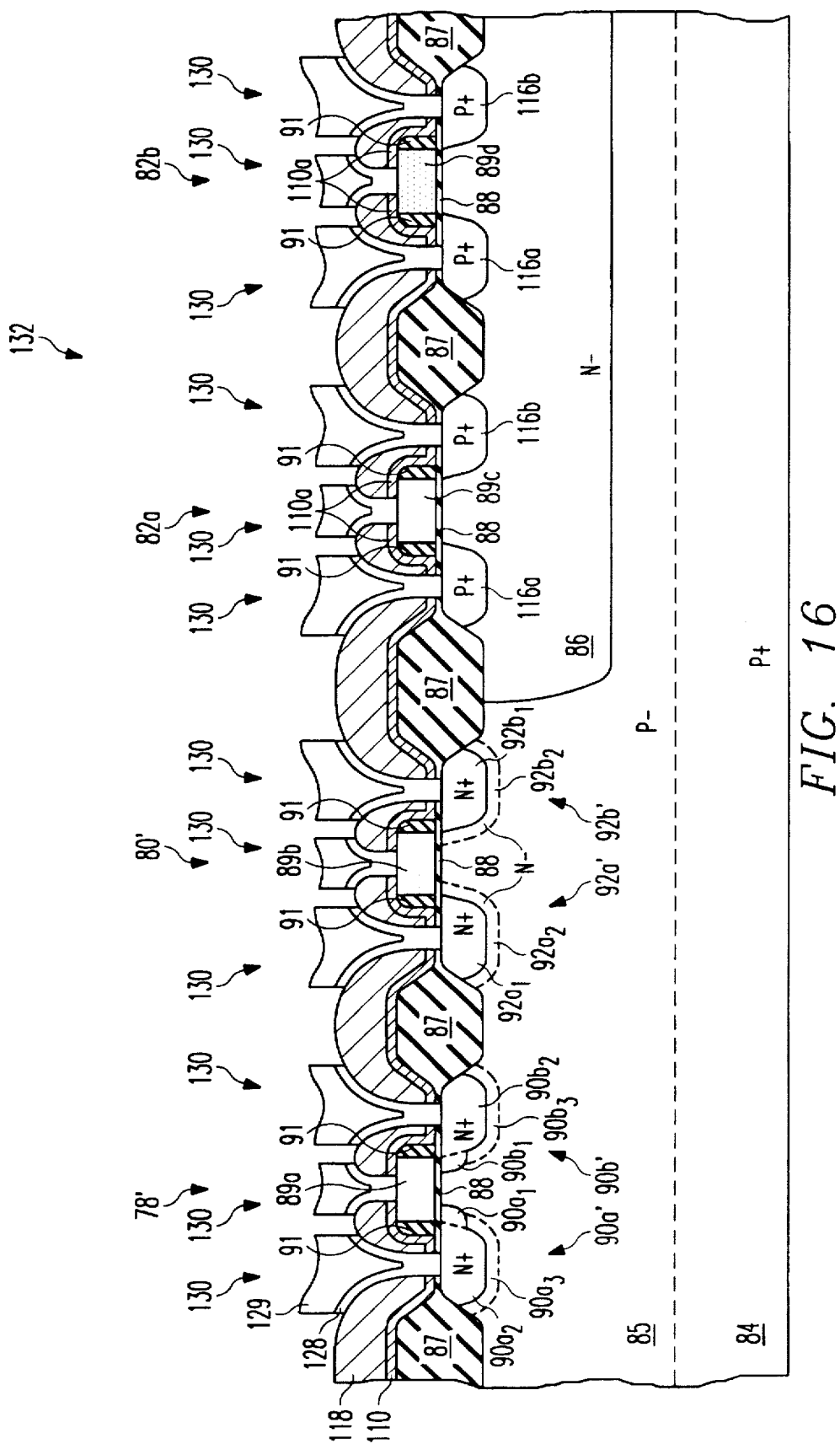
FIG. 16 is a cross-sectional elevation view of a semiconductor device according to a second embodiment of the invention.

FIG. 16 is a cross-sectional elevation view of a portion of a semiconductor device 132 according to a second embodiment of the invention. Device 132 is identical to device 76 of FIG. 5 with the exception that in place of the single impurity implant used to form single doped source/drain (SDD) regions 92 and N+ regions 90b (see FIGS. 5 and 11), a double impurity implant is performed.

As a result of the double implant, low-voltage transistor 80' of device 132 has a pair of double doped source/drain (DDD) regions 92a' and 92b'. Source/drain region 92a' includes a heavily-doped N+ portion $92a_1$ and a lightly-doped N– portion $92a_2$, both of which are self-aligned with a sidewall spacer 91. N– portion $92a_2$ extends around the side and bottom edges of N+ portion $92a_1$. Source/drain region 92b' includes a heavily-doped N+ portion $92b_1$ and a lightly-doped N– portion $92b_2$, both of which are self-aligned with a sidewall spacer 91. N– portion $92b_2$ extends around the side and bottom edges of N+ region $92b_1$. High-voltage transistor 78' has a pair of source/drain regions 90a' and 90b'. Source/drain region 90a' includes lightly-doped N– portion $90a_1$ that is self-aligned with an edge of gate 89a, heavily-doped N+ portion $90a_2$ that is self-aligned with a sidewall spacer 91, and, as a result of the double implant, a lightly-doped N− portion $90a_3$ that is self-aligned with a sidewall spacer 91. N− region $90a_3$ extends around the side and bottom edges of N+ region $90a_2$. Source/drain region 90b' includes lightly-doped N− portion $90b_1$ that is self-aligned with an edge of gate 89a, heavily-doped N+ portion $90b_2$ that is serf-aligned with a sidewall spacer 91, and, as a result of the double implant, a lightly-doped N− portion $90b_3$ that is self-aligned with a sidewall spacer 91. N− region $90b_3$ extends around the side and bottom edges of N+ region $90b_2$.

The process used to form device 132 is identical to the process described above with respect to FIGS. 6–12 with the exception that immediately after the arsenic implant described above with respect to FIG. 11, phosphorus is implanted in P− epitaxial layer 85 with a dose of 4.0E14 at 150 keV through window 131.

Device 132 of FIG. 16 provides the same advantages as device 76 of FIG. 5. That is, the high-voltage CMOS portion of semiconductor device 132 includes LDD NMOS transistors, such as transistor 78', that are capable of operating continuously at high voltages while the low-voltage CMOS portion of semiconductor device 132 includes DDD NMOS transistors, such as transistor 80', that operate reliably at digital voltage levels and are capable of being scaled to channel lengths of less than 2 microns. In addition, the PMOS transistors in the low-voltage CMOS portion of semiconductor device 132, such as transistor 82a, utilize sidewall spacer extension regions 110a to improve short-channel behavior and permit scaling to channel lengths of less than 2 microns.

Figure 17:
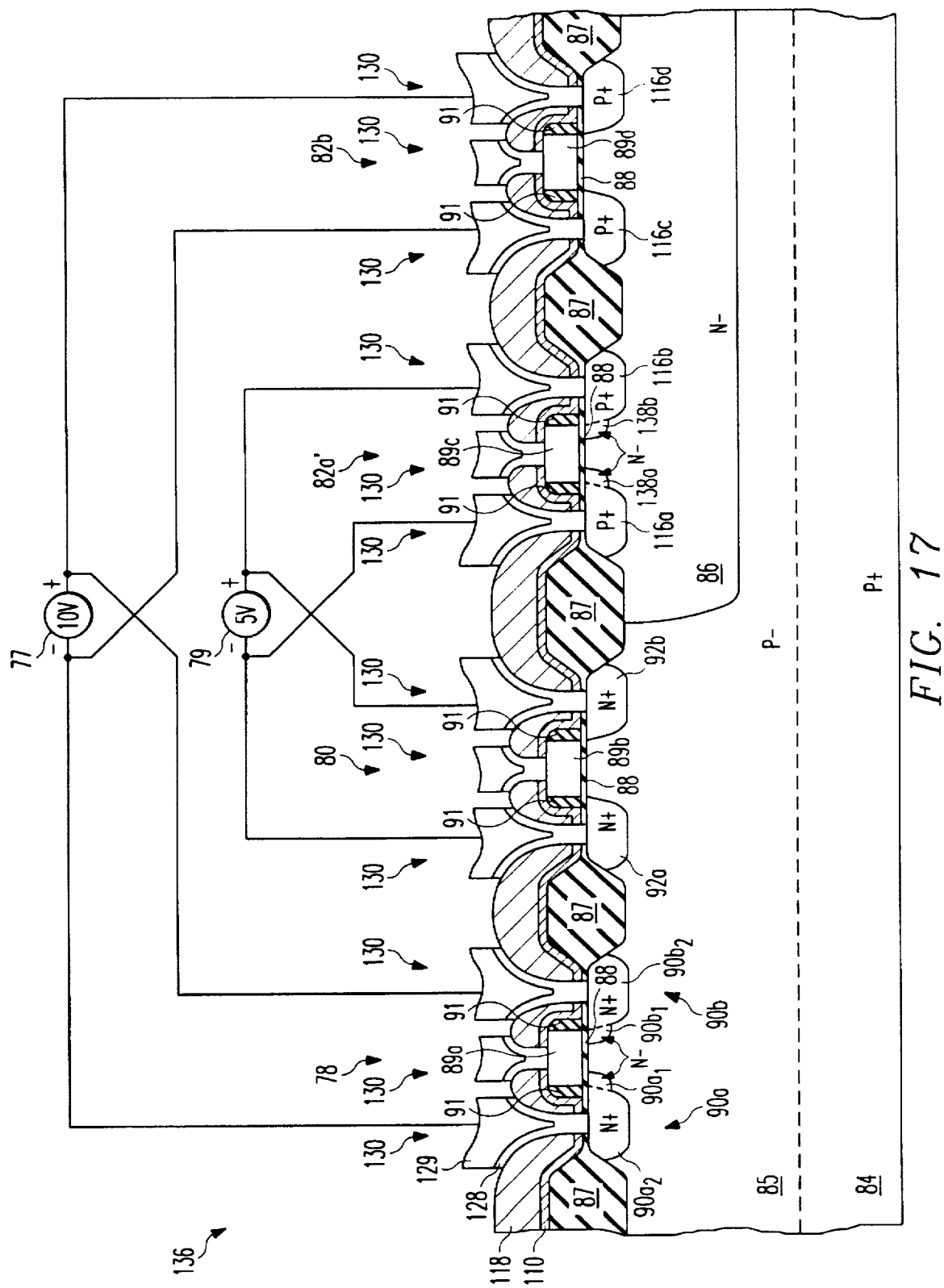
FIG. 17 is a cross-sectional elevation view of a semiconductor device according to a third embodiment of the invention.

FIG. 17 is a cross-sectional elevation view of a portion of a semiconductor device 136 according to a third embodiment of the invention. Device 136 is identical to device 76 of FIG. 5 with the exception that low-voltage PMOS transistor 82a of FIG. 5 is replaced with a "reverse" LDD PMOS transistor 82a'. Low-voltage "reverse" LDD PMOS transistor 82a' differs from transistor 82a in that in the channel region of transistor 82a' are lightly-doped N− regions 138a and 138b located adjacent source/drain regions 116a and 116b, respectively. N− regions 138a and 138b are more heavily doped than N− well 86. N− regions 138a and 138b are self-aligned with gate 89c of transistor 82a'. N− regions 138a and 138b act as punch-through stops that allow PMOS transistor 82a' to function at channel lengths that are less than those possible with transistor 82a of FIG. 5. The phrase "'reverse' LDD" refers to the fact that the lightly-doped regions 138a and 138b of PMOS transistor 82a' are N− instead of P− as would be found in a standard LDD PMOS transistor.

Figure 18:
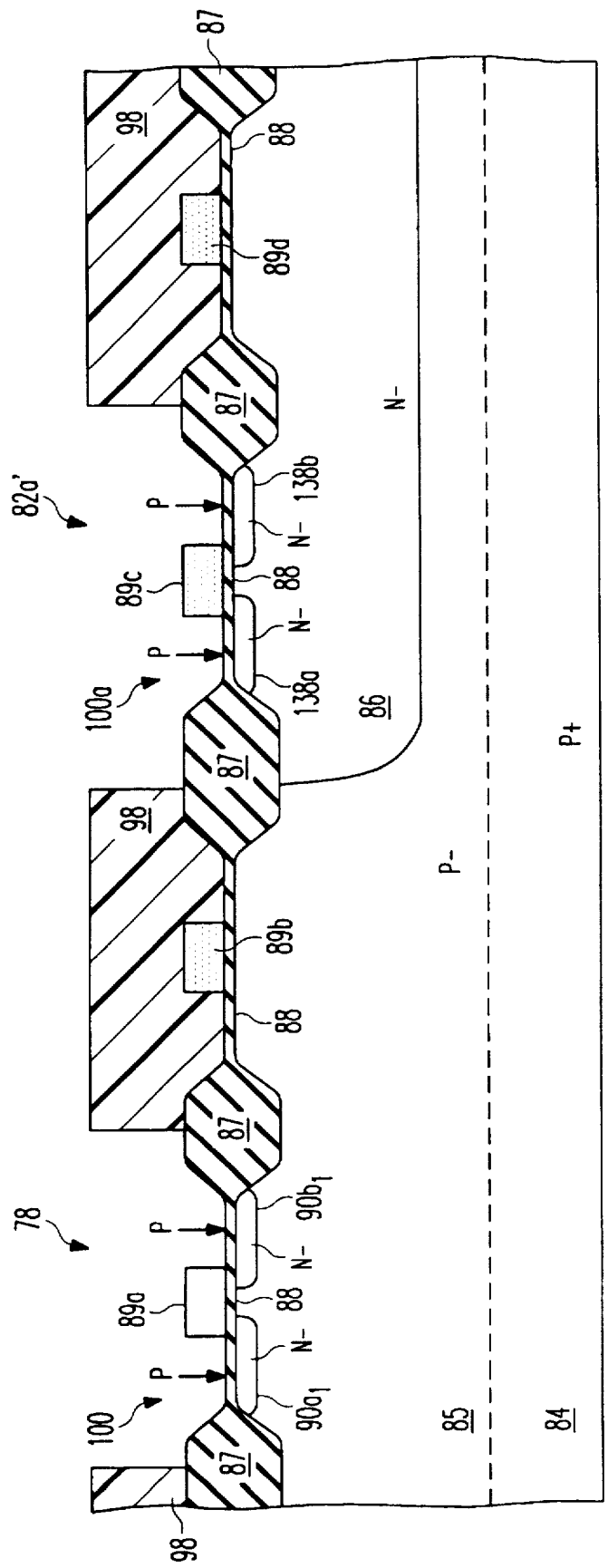
FIGS. 18 is a cross-sectional elevation view of the semiconductor device of FIG. 17 during fabrication.

The process used to form device 136 is identical to the process described above with respect to FIGS. 6–12 with the exception that the N− LDD implant step described with respect to FIG. 9 is modified as shown in FIG. 18. As seen in FIG. 18, photoresist layer 98 is patterned to form an additional window 100a over N− well 86 additionally exposing gate 89c and adjacent portions of gate oxide layer 88 for N− LDD implantation while blocking implantation in moat regions for high-voltage PMOS transistor 82b. An impurity, such as phosphorus, is then implanted with a dose of 2.6E13 atoms/cm² at 150 keV in P− epitaxial layer 85 and N− well 86 through windows 100 and 100a, respectively, to form N− LDD source/drain regions $90a_1$ and $90a_2$ that are self-aligned with gate 89a and "reverse" N− LDD regions 138a and 138b that are self-aligned with gate 89c.

The subsequent P+ implant that forms P+ source/drain regions 116a and 116b (see FIG. 12) is offset from the N− LDD implant by sidewall spacers 91 and layer 110. As a result, although the P+ source/drain regions 116a and 116b of transistor 82a' diffuse back under the edges of gate 89, N− regions 138 are still present in the channel region between P+ source/drain regions 116a and 116b as seen in FIG. 17 to function as punch-through stops.

Figure 19:
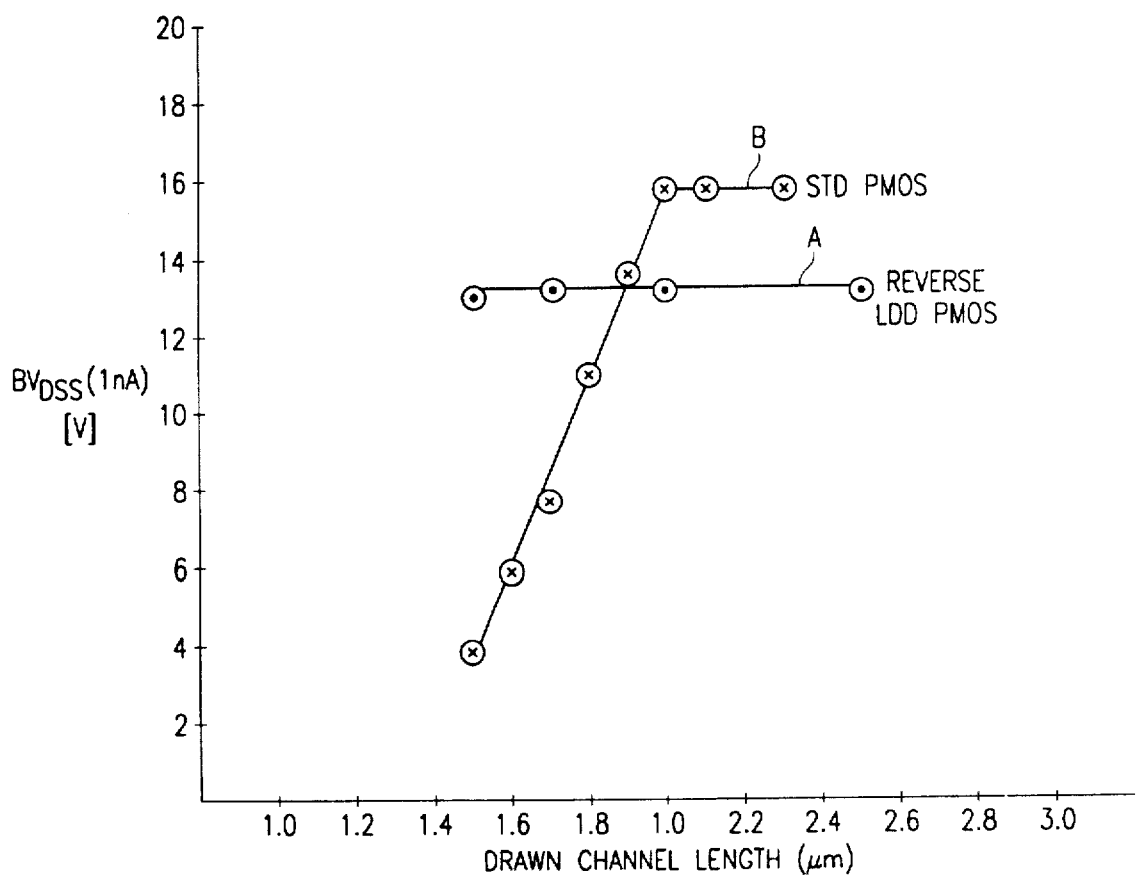
FIG. 19 is a graph showing breakdown voltage as a function of channel length for PMOS transistors, such as transistor 82a' of FIG. 16 and transistor 44b of FIG. 3.

FIG. 19 is a graph illustrating the relationship between breakdown voltage ($BV_{DSS}$) and drawn channel length for a PMOS device, such as transistor 82a' of FIG. 17, having both sidewall spacers 91, sidewall spacer extension regions 110a, and "reverse" N− LDD regions 138a and 138b in curve A and for a PMOS device, such as transistor 44a of FIG. 3, having only sidewall spacers 60 in curve B. As seen in curve B of FIG. 19, the onset of punch-through for transistor 44a occurs at about 2 microns while, as seen in curve A, the breakdown voltage for transistor 82a' is relatively constant down to about 1.5 microns, illustrating the improved punch-through performance provided by the "reverse" LDD process. The use of "reverse" N− LDD regions 138a and 138b in conjunction with sidewall spacer extension regions 110a thus permits an even further reduction in size for the low-voltage PMOS transistors.

Figure 20:
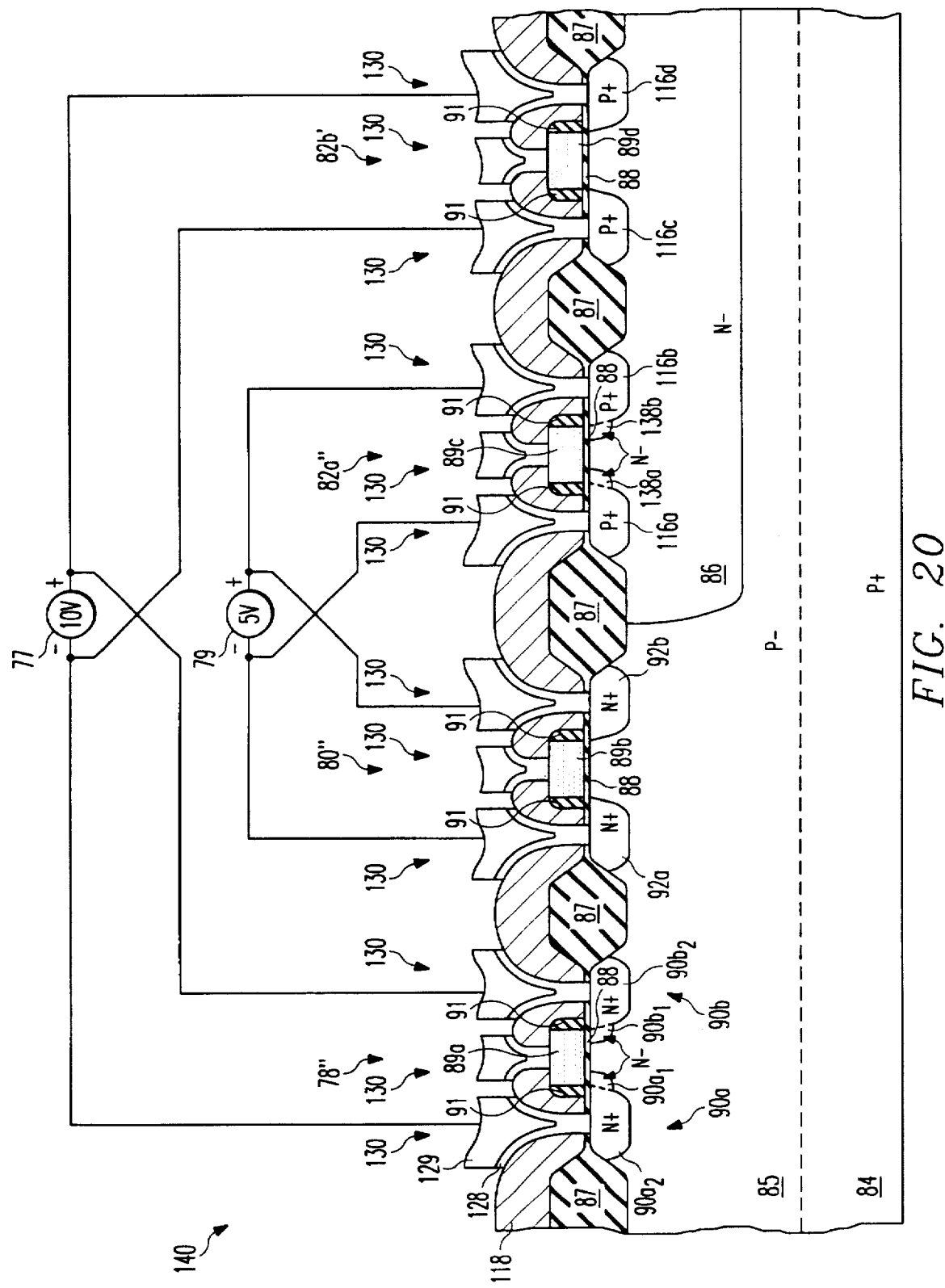
FIG. 20 is a cross-sectional elevation view of a semiconductor device according to a fourth embodiment of the invention.

A reduction in PMOS transistor size can also be achieved using the "reverse" N− LDD regions 138a and 138b without sidewall spacer extension regions 110a as illustrated in FIG. 20. FIG. 20 is a cross-sectional elevation view of a portion of a semiconductor device 140 according to a fourth embodiment of the invention. Device 140 is identical to device 136 of FIG. 17 with the exception that thin insulator layer 110 is omitted. The process used to form device 140 is also identical to that used to form device 136 with the exception that the step of forming thin insulator layer 110 is omitted. As a result, each of P+ source/drain regions 116a–116d of transistors 82a" and 82b' is self-aligned with an associated sidewall spacer 91. The channel lengths of transistors 82a" and 82b' are therefore reduced by about twice the thickness of layer 110 with respect to the channel lengths of transistors 82a' and 82b of FIG. 17. However, N− regions 138a and 138b still function as punch-through stops that allow PMOS transistor 82a" to function at channel lengths that are less than those possible with transistor 46b of FIG. 3 permitting low-voltage PMOS transistors to be reduced in scale.

Removal of thin insulator layer 110 does not affect the channel lengths of transistors 78" and 80" with respect to the channel lengths of transistors 78 and 80 of FIG. 17. Thus, transistor 78", like transistor 78, includes source/drain regions 90 having N− regions $90a_1$ and $90b_1$ that are self-aligned with gate 89a and N+ regions $90a_2$ and $90b_2$ that are self-aligned with an associated sidewall spacer 91. Transistor 80", like transistor 80, includes source/drain regions 92a and 92b that are self-aligned with an associated sidewall spacer 91.

Figure 21:
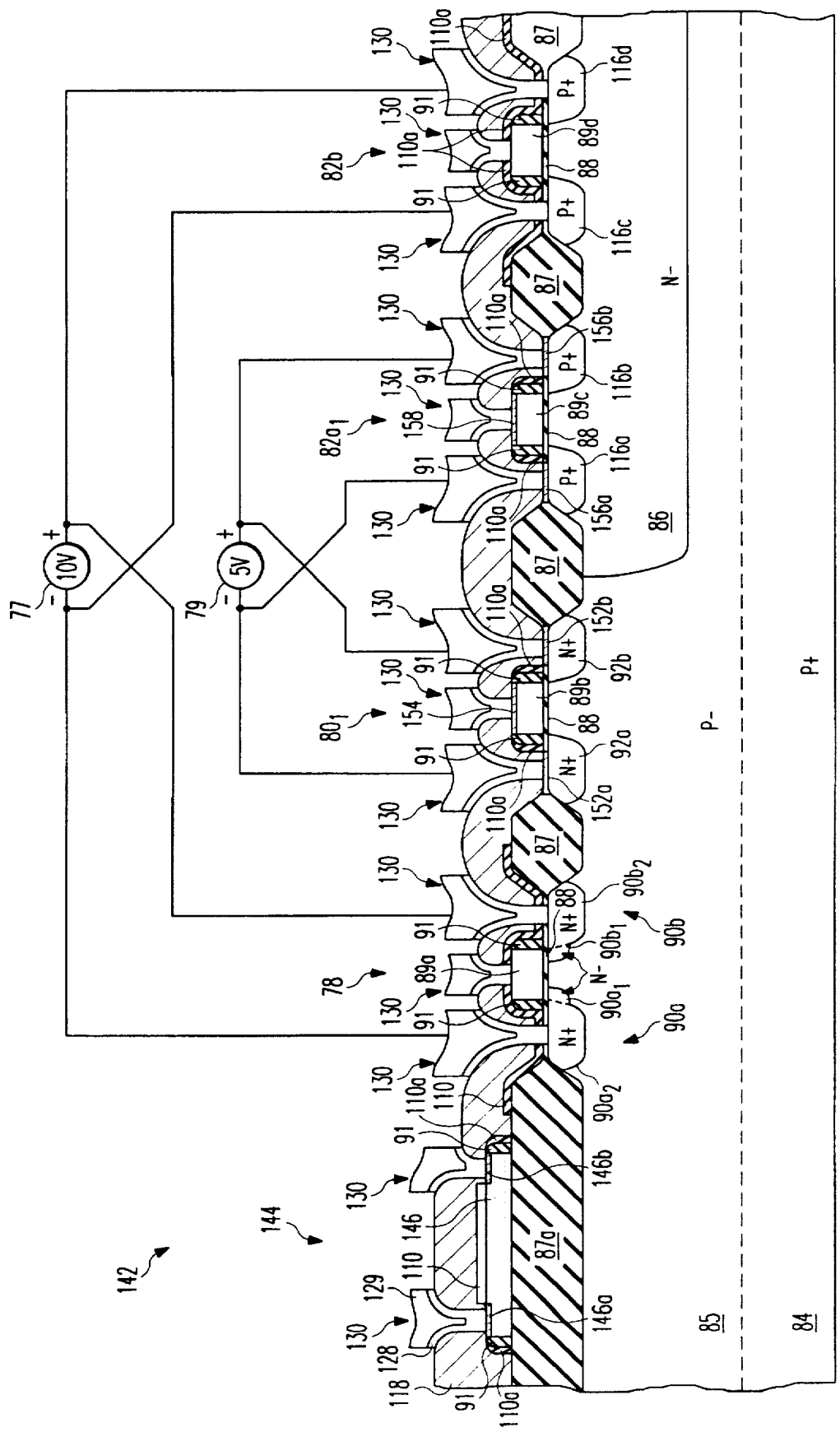
FIG. 21 is a cross-sectional elevation view of a semiconductor device according to a fifth embodiment of the invention.
Figure 22:
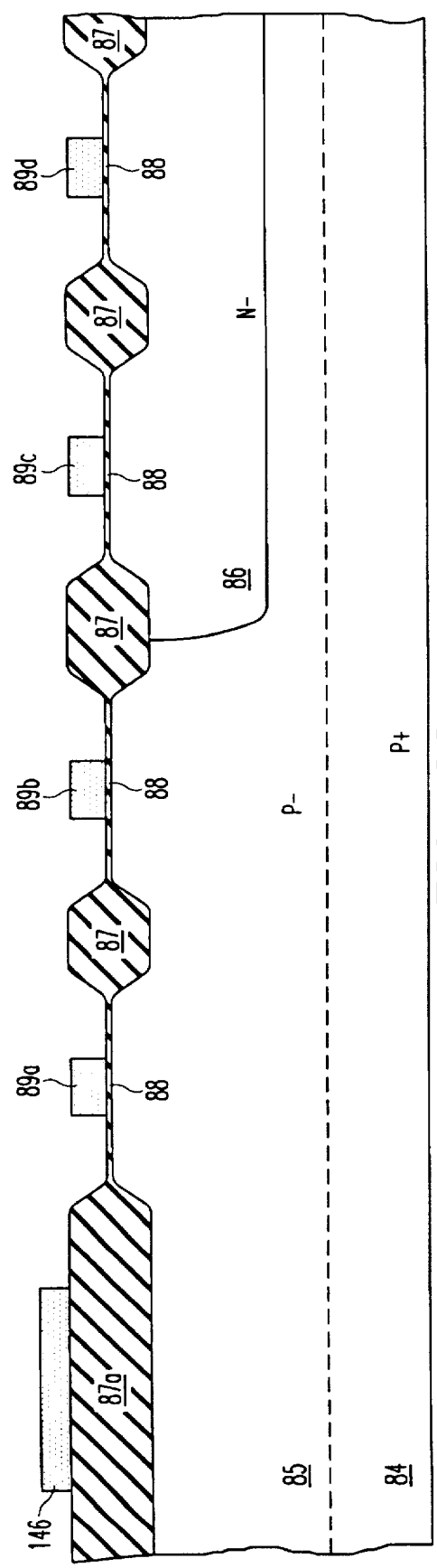
FIGS. 22–29 are cross-sectional elevation views of the semiconductor device of FIG. 21 at successive stages during fabrication.
Figure 23:
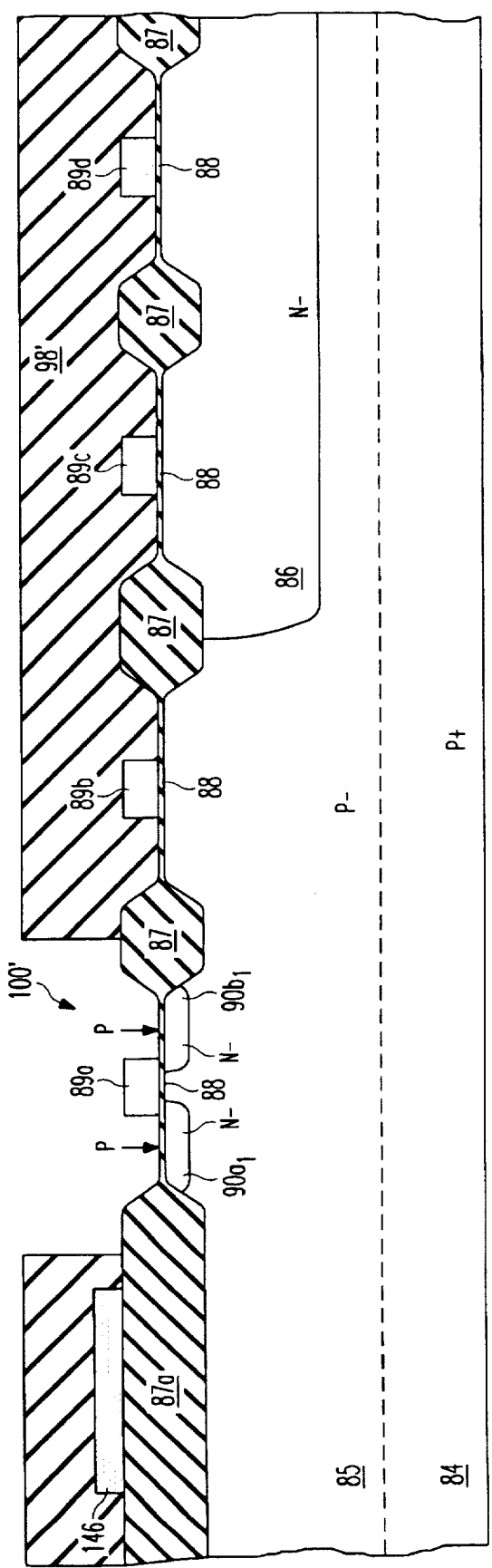
Figure 24:
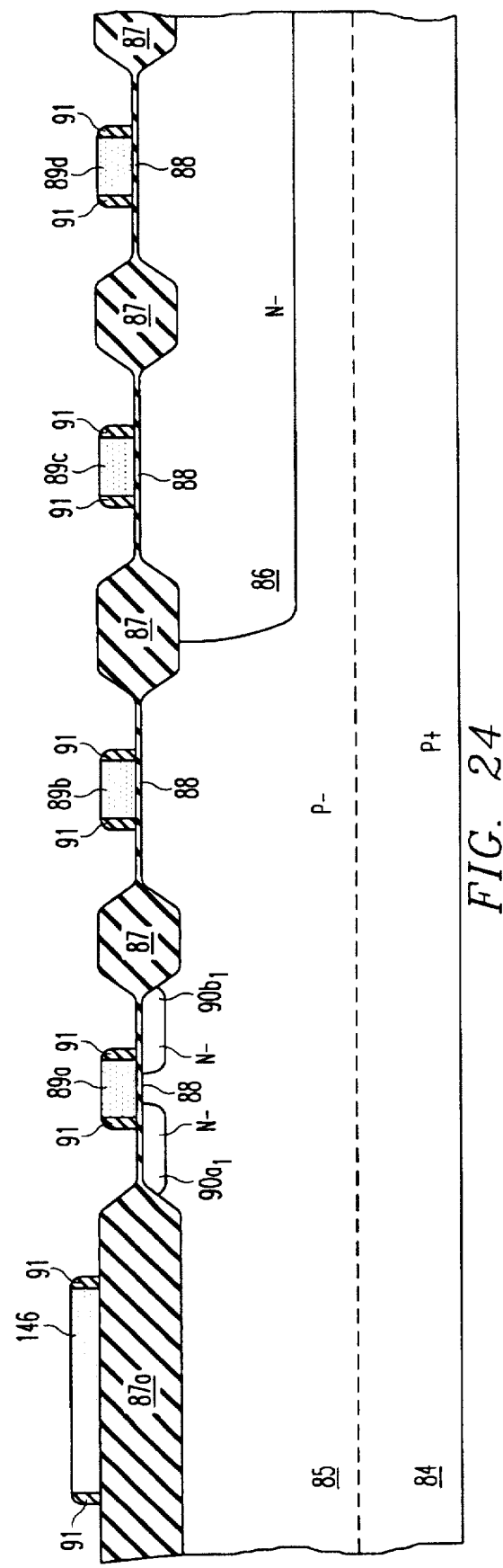
Figure 25:
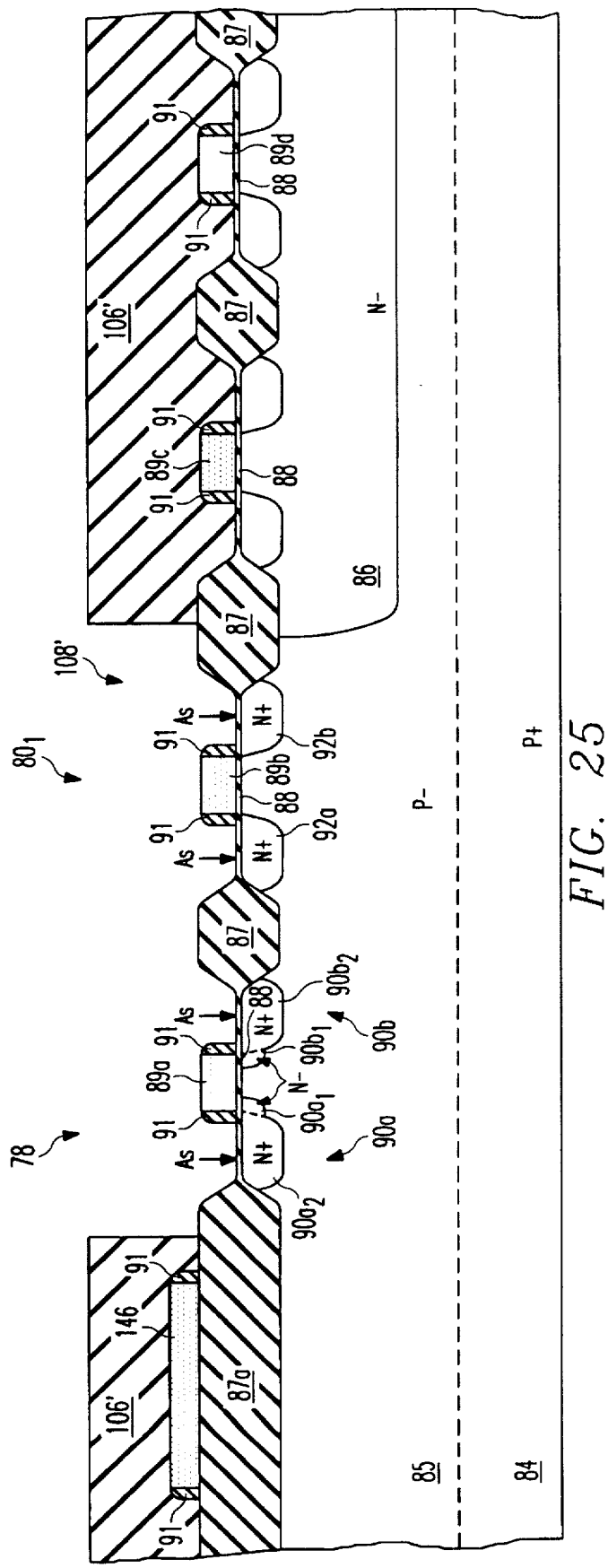
Figure 26:
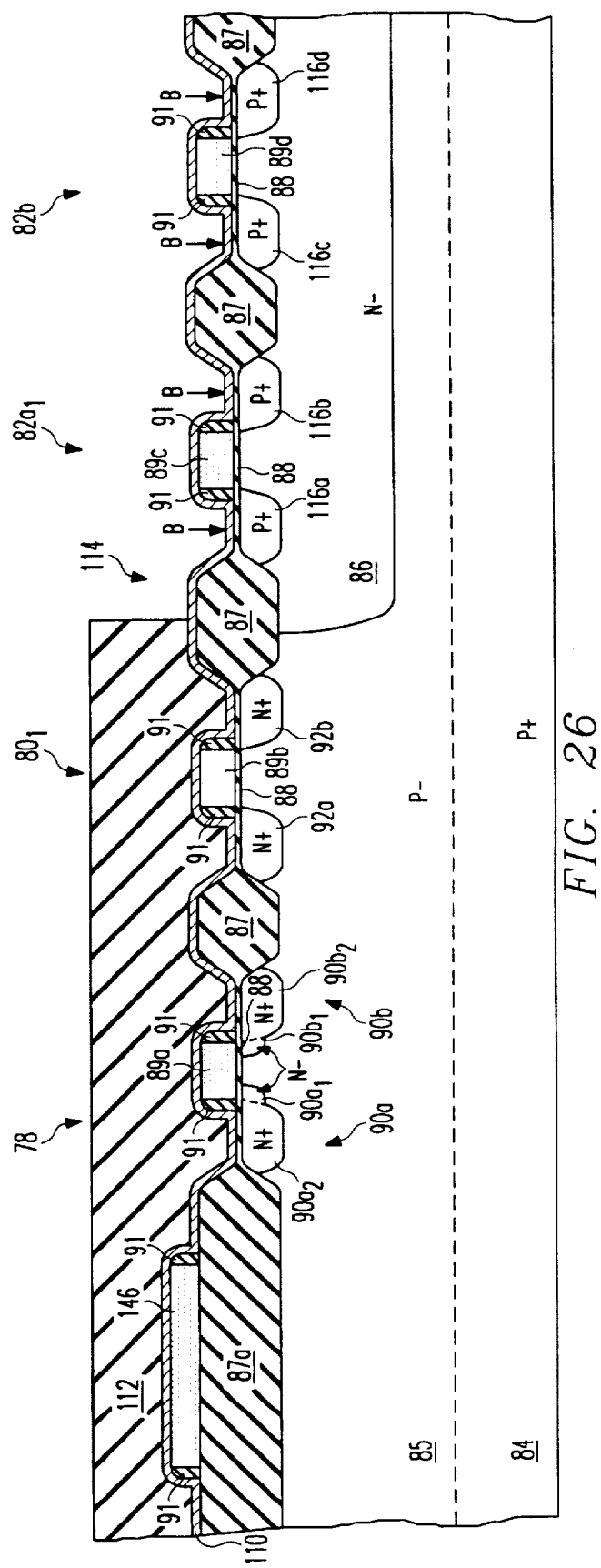

FIG. 21 is a cross-sectional elevation view of a portion of a semiconductor device 142 according to a fifth embodiment of the invention. Device 142 is identical to device 76 of FIG. 5 with the exception that low-voltage transistor 80 is replaced with salicided low-voltage transistor $80_1$, low-voltage transistor 82a is replaced with salicided low-voltage transistor $82a_1$, and a resistor 144 is added. The use of salicided transistors $80_1$ and $82a_1$ is desirable in situations where the resistance of the source/drain regions of the low-voltage transistors must be reduced so as to not adversely affect their current-delivering capability. As previously discussed with respect to FIGS. 5 and 15, oxide layer 110 provides sidewall spacer extension regions 110a over sidewall spacers 91 to permit a reduction in size of PMOS transistors. As will be described in detail below, this embodiment of the invention illustrates how oxide layer 110 can additionally be used to selectively block the silicidation process over resistors, such as resistor 144, that are required to have high resistances. The selective blocking of the silicidation process over resistors that are required to have a high resistance prevents them from becoming low resistance resistors.

Transistor $80_1$ is identical to transistor 80 of FIG. 5 with the exception that salicide (self-aligned silicide) layers 152a and 152b are formed on the surface of source/drain regions 92a and 92b, respectively, and a salicide layer 154 is formed on the surface of gate 89b. In transistor $80_1$, contacts 130 contact salicide layers 152a, 152b, and 154.

Transistor $82a_1$ is identical to transistor 82a of FIG. 5 with the exception that salicide (self-aligned silicide) layers 156a and 165b are formed on the surface of source/drain regions 116a and 116b, respectively, and a salicide layer 158 is formed on the surface of gate 89c. In transistor $82a_1$, contacts 130 contact salicide layers 156a, 156b, and 158.

Resistor 144 includes a polysilicon strip 146 formed over field oxide region 87a. Sidewall spacers 91 are formed on the sidewalls of strip 146. Oxide layer 110 extends over the center portion of polysilicon strip 146. Oxide layer 110 includes sidewall spacer extension regions 110a formed over sidewall spacers 91. Resistor 144 also includes salicide layers 146a and 146b that are formed on the surface of strip 146 through openings in oxide layer 110 on opposite ends of polysilicon strip 146. Contacts 130 extend through windows in doped glass layer 118 and contact salicide layers 146a and 146b. Where oxide layer 110 exists on the surface of strip 146, silicide is prevented from By forming salicide layers 146a and 146b only on the ends of strip 146 where contact is to be made, resistor 144 may retain a high resistance while assuring good connection to contacts 130.

Successive stages in a method of fabricating semiconductor device 142 of FIG. 21 are shown in FIGS. 22–28. Initially, N well 86 formed in epitaxial layer 85 using the process steps described above with respect to FIG. 6. Field oxide regions 87 and 87a and gate oxide layers 88 are then formed using the process steps described above with respect to FIG. 7. A polysilicon layer having a thickness of about 5000 Angstroms is then deposited over gate oxide layer 88 and field oxide regions 87 and doped with an impurity, such as phosphorus, to render it conductive (about 20Ω per square). The polysilicon layer is patterned and etched to form gates 89a–89d and polysilicon strip 146 resulting in the structure shown in FIG. 22.

A layer of photoresist 98' is then formed on the surface of the wafer and patterned to form a window 100' exposing gate 89a and adjacent portions of gate oxide layer 88 for source/drain implantation. An impurity, such as phosphorus, is then implanted in P– epitaxial layer 85 with a dose of 2.6E13 atoms/cm$^2$ at 150 keV through window 100 to form N– source/drain regions $90a_1$ and $90b_1$ self-aligned with the exposed gate 89a resulting in the structure shown in FIG. 23.

Photoresist layer 98' is then removed and a conformal oxide layer (not shown) is deposited over the wafer using low pressure chemical vapor deposition, for example, with a thickness of about 0.30 microns. The conformal oxide layer is then anisotropically etched using reactive ion etching or plasma etching techniques leaving oxide sidewall spacers 91 on the near-vertical edges of gates 89a–89d and polysilicon strip 146 resulting in the structure of FIG. 24. The width of sidewall spacers 91 is approximately 0.30 microns, the thickness of conformal oxide layer from which they are etched.

A new layer of photoresist 106' is then formed on the surface of the wafer and patterned to form a window 108' exposing areas in which N+ source/drain implants are desired. An impurity, such as arsenic, is then implanted in P– epitaxial layer 85 with a dose of 8.0E15 atoms/cm$^2$ at 135 keV through window 108' to form a pair of N+ source/drain regions 92a and 92b for NMOS transistor $80_1$ and a pair of N+ regions $90a_2$ and $90b_2$ for NMOS transistor 78. N+ source/drain regions 92a and 92b and N+ regions $90a_2$ and $90b_2$ are self-aligned with associated sidewall spacers 91. An anneal is then performed to activate the implant and drive the junction to a depth of about 0.45 microns resulting in the structure shown in FIG. 25.

Photoresist layer 106' is then removed and a layer 110 of LPCVD oxide is then deposited on the surface of the wafer to a thickness of approximately 0.15 micrometers. A layer of photoresist 112 is then formed on layer 110 and patterned to form a window 114 exposing areas in which P+ implants are desired. An impurity, such as boron, is then implanted in N– well 86 with a dose of 4.0E15 atoms/cm$^2$ at 40 keV through the window 114 to form a pair of P+ source/drain regions 116a and 116b for PMOS transistor $82a_1$ and a pair of P+ source/drain regions 116c and 116d for PMOS transistor 82b resulting in the structure shown in FIG. 26.

Figure 27:
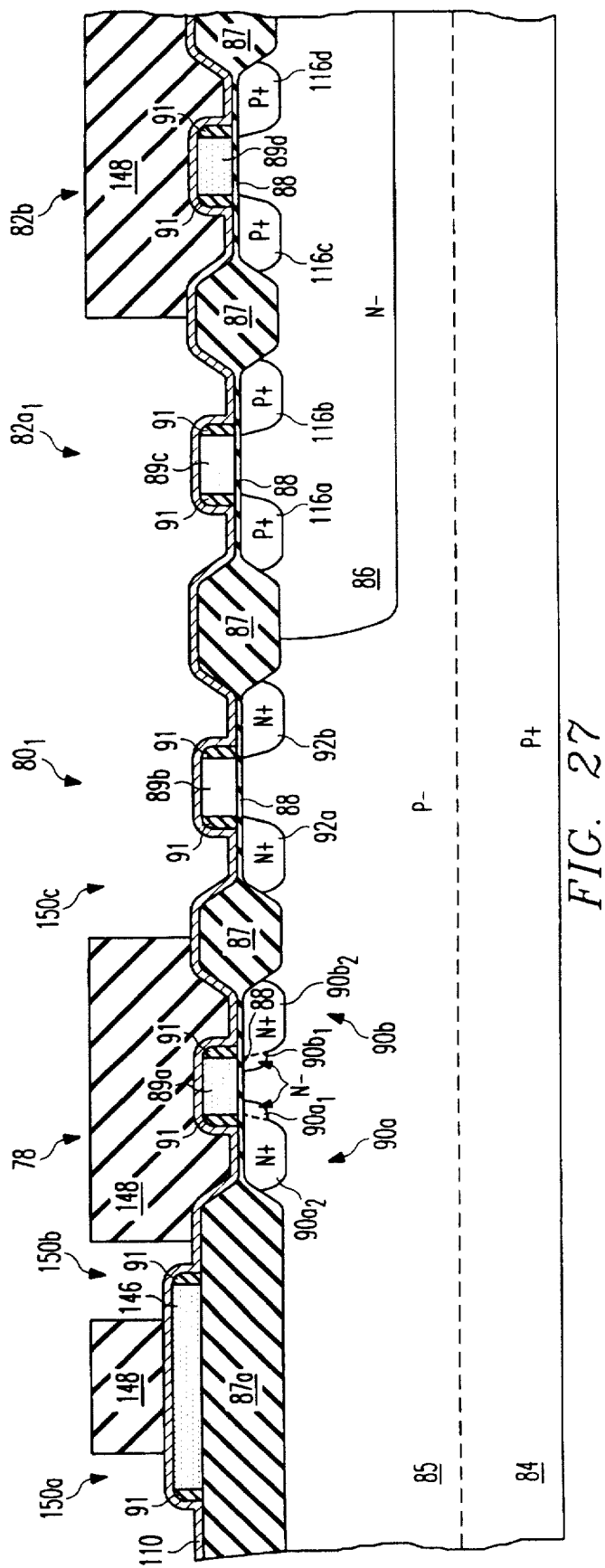

Photoresist layer 112 is then removed and a new layer of photoresist 148 is formed on layer 110 and patterned to form windows 150a–150c. Windows 150a and 150b expose portions of oxide layer 110 covering opposite ends of polysilicon strip 146 as shown in FIG. 27. Window 150c exposes portions of oxide layer 110 covering gate 89 and source/drain regions 92 of transistor $80_1$ and portions of oxide layer 110 covering gate 89 and source/drain regions 116 of transistor $82a_1$.

Figure 28:
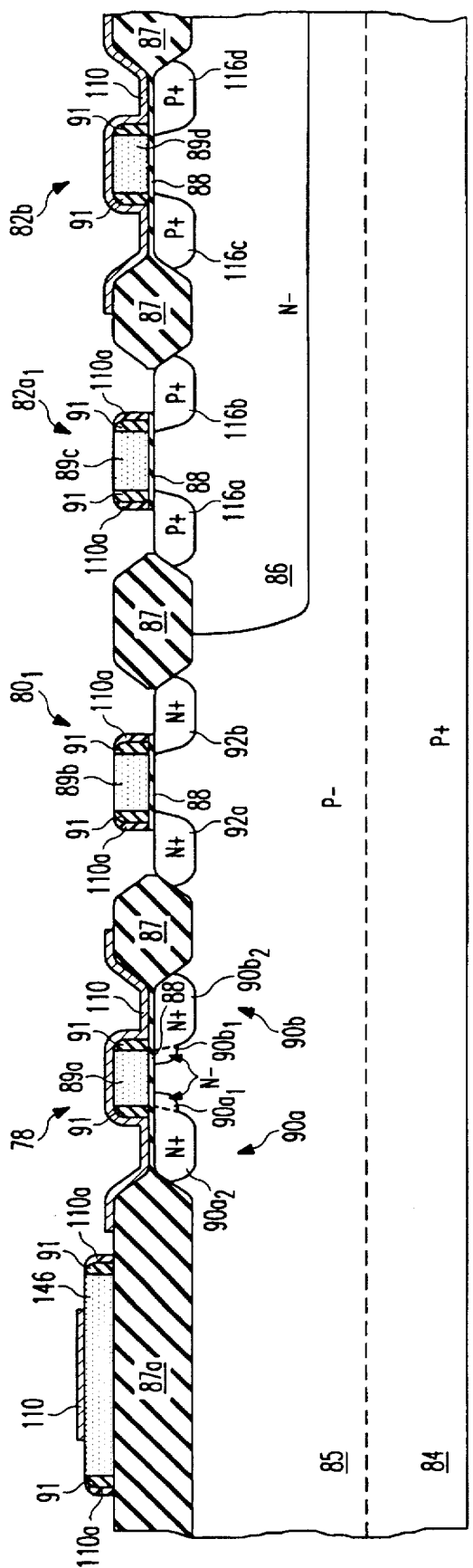

An anisotropic etch is then performed to remove the exposed portions of oxide layer 110 except for sidewall spacer extension regions 110a and portions of gate oxide layer 88 between sidewall spacer extension regions 110a and thick field oxide regions 87 resulting in the structure of FIG. 28. As seen in FIG. 28, silicon is exposed on opposite ends of polysilicon strip 146, on gate 89b and source/drain regions 92a and 92b of transistor $80_1$, and on gate 89c and source/drain regions 116a and 116b of transistor $82a_1$.

Figure 29:
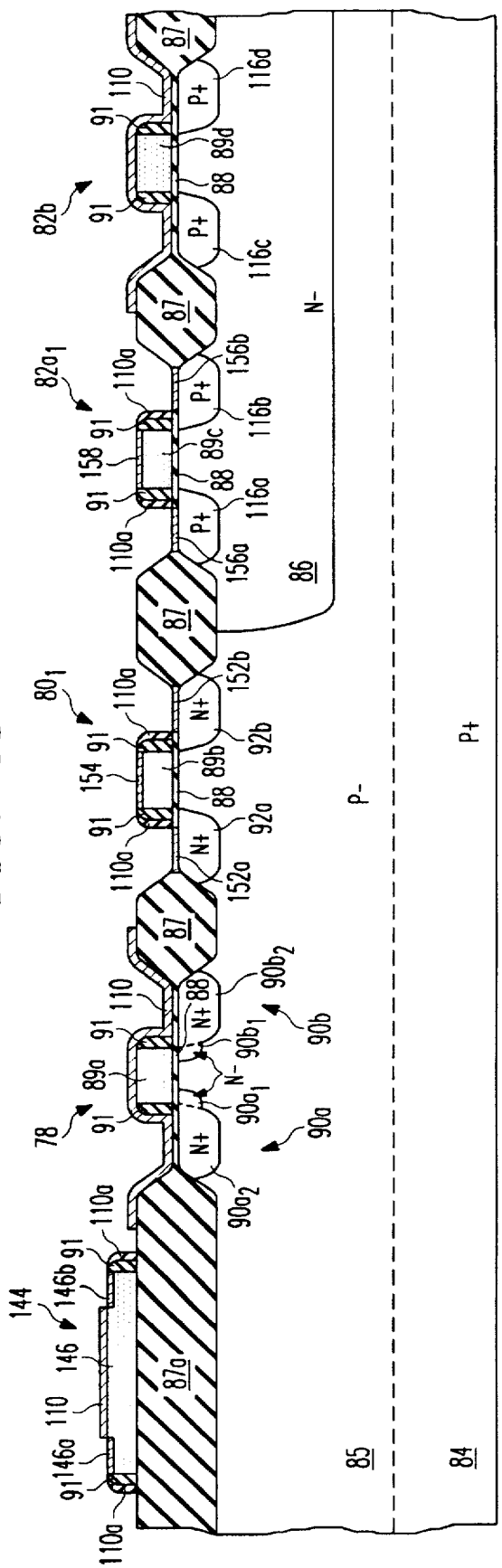

Photoresist layer 148 is then removed and a thin film of a refractory metal, such as platinum, having a thickness in the range of 450–1200 Angstroms, is then deposited on the wafer and reacted to form salicide (self-aligned silicide) layers 146a, 146b, 152a, 152b, 154, 156a, 156b, and 158 on the exposed silicon areas. The unreacted metal is then removed resulting in the structure of FIG. 29.

A doped glass layer (MLO) 118 having a thickness of about 10000 Angstroms is then formed on the surface of the wafer and patterned and etched to form windows extending through layer 118 to expose salicide layers 146a, 146b, 152a, 152b, 154, 156a, 156b, and 158; through layer 118 and layer 110 to expose contact areas on gates 89a and 89d of transistors 78 and 82b; and through layer 118, layer 110 and gate oxide layer 88 to expose contact areas on N+ source/drain regions 90a and 90b of transistor 78 and P+ source/drain regions 116c and 116d of transistor 82b.

Contacts are then formed by depositing a first metal layer 128 of TiW having a thickness of about 2000 Angstroms over the wafer and then depositing a second metal layer 129 of Al-Si-Cu having a thickness of about 7500 Angstroms over the first metal layer 128. The first and second metal layers 128 and 129 are then patterned and etched to form contacts 130 for contacting silicide layers 146a, 146b, 152a, 152b, 154, 156a, 156b, and 158 and the gates 89a and 89d and source/drain regions 90a, 90b, 116c and 116d of NMOS transistor 78 and PMOS transistor 82b. This results in the structure shown in FIG. 21.

A few preferred embodiments have been described in detail hereinabove. It is to be understood that the scope of the invention also comprehends embodiments different from those described, yet within the scope of the claims.

For example, in FIGS. 16 and 21, PMOS transistors 82a and 82a₁ could be provided with the N– regions 138a and 138b of FIG. 17. In FIG. 20 and FIG. 21, source/drain regions 90a, 90b, 92a, and 92b could be replaced with source/drain regions 90a', 90b', 92a', and 92b' of FIG. 16.

While this invention has been described with reference to illustrative embodiments, this description is not intended to be construed in a lighting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a semiconductor device, comprising the steps of:

forming first and second gates over and insulated from a layer of P type semiconductor material;

forming a mask over said second gate and regions of said layer of P type semiconductor material adjacent said second gate, said mask exposing said first gate and regions of said layer of P type semiconductor material adjacent said first gate;

doping said layer of P type semiconductor material with an N type impurity to form a first pair of N type regions in said layer of P type semiconductor material self-aligned with said first gate, said mask blocking said N type impurity from regions adjacent said second gate;

removing said mask;

forming a first pair of sidewall spacers on sidewalls of said first gate and a second pair of sidewall spacers on sidewalls of said second gate;

forming a second pair of N type regions self-aligned with said first pair of sidewall spacers and a third pair of N type regions self-aligned with said second pair of sidewall spacers, said second and third pairs of N type regions being more heavily doped than said first pair of N type regions, diffusing said third pair of N type regions to extend under said second gate.

2. The method of claim 1 further comprising the steps of:

forming a fourth pair of N type regions self-aligned with said first pair of sidewall spacers and a fifth pair of N type regions self-aligned with said second pair of sidewall spacers, said fourth and filch pairs of N type regions extending farther into said layer of P type semiconductor material than said second and third pairs of N type regions, said second and third pairs of N type regions being more heavily doped than said fourth and fifth pairs of N type regions.

3. The method of claim 1 further comprising the steps of:

forming an N well in said layer of P type semiconductor material;

forming a third gate and a fourth gate over and insulated from said N well;

forming a third pair of sidewall spacers on sidewalls of said third gate and a fourth pair of sidewall spacers on sidewalls of said fourth gate;

forming an insulator layer over said N well, said insulator layer including a first pair of sidewall spacer extension regions formed over said third pair of sidewall spacers and a second pair of sidewall spacer extension regions formed over said fourth pair of sidewall spacers;

forming a first pair of P type regions self-aligned with said first pair of sidewall spacer extension regions and a second pair of P type regions self-aligned with said second pair of sidewall spacer extension regions.

4. The method of claim 3 further comprising the steps of:

connecting a first voltage source across said first and second pairs of N type regions and across said second pair of P type regions;

connecting a second voltage source across said third pair of N type regions and across said first pair of P type regions, said first voltage source supplying a larger voltage than said second voltage source.

5. The method of claim 1 further comprising the steps of:

forming an N well in said layer of P type semiconductor material;

forming a third gate and a fourth gate over and insulated from said N well;

forming a pair of N type regions in said N well self-aligned with said third gate;

forming a third pair of sidewall spacers on sidewalls of said third gate and a fourth pair of sidewall spacers on sidewalls of said fourth gate;

forming an insulator layer over said N well, said insulator layer including a first pair of sidewall spacer extension regions formed over said pair of third sidewall spacers and a second pair of sidewall spacer extension regions formed over said pair of fourth sidewall spacers;

forming a first pair of P type regions self-aligned with said first pair of sidewall spacer extension regions and a second pair of P type regions self-aligned with said second pair of sidewall spacer extension regions.

6. The method of claim 5 further comprising the steps of:

connecting a first voltage source across said first and second pairs of N type regions and across said second pair of P type regions;

connecting a second voltage source across said third pair of N type regions and across said first pair of P type regions, said first voltage source supplying a larger voltage than said second voltage source.

7. The method of claim 1 further comprising the steps of:

forming an N well in said layer of P type semiconductor material;

forming a third gate and a fourth gate over and insulated from said N well;

forming a pair of N type regions in said N well self-aligned with said third gate;

forming a third pair of sidewall spacers on sidewalls of said third gate and a fourth pair of sidewall spacers on sidewalls of said fourth gate;

forming a first pair of P type regions self-aligned with said third pair of sidewall spacers and a second pair of P type regions self-aligned with said fourth pair of sidewall spacers.

8. The method of claim 7 further comprising the steps of:

connecting a first voltage source across said first and second pairs of N type regions and across said second pair of P type regions;

connecting a second voltage source across said third pair of N type regions and across said first pair of P type regions, said first voltage source supplying a larger voltage than said second voltage source.

9. The method of claim 1 further comprising the steps of:

forming an N well in said layer of P type semiconductor material;

forming a third gate over and insulated from said N well and a polysilicon strip over and insulated from said layer of P type semiconductor material;

forming a third pair of sidewall spacers on sidewalls of said third gate;

forming an insulator layer over said layer of P type semiconductor material, said insulator layer including a first pair of sidewall spacer extension regions formed over said third pair of sidewall spacers;

etching said insulator layer to expose opposite ends on said polysilicon strip;

forming a first pair of P type regions self-aligned with first pair of sidewall spacer extension regions; and forming layers of silicide on said exposed ends of said polysilicon strip.

10. A method for forming a semiconductor device, comprising the steps of:

forming first and second gates over and insulated from a layer of P type semiconductor material;

forming a first pair of N type regions self-aligned with said first gate;

forming a first pair of sidewall spacers on sidewalls of said first gate and a second pair of sidewall spacers on sidewalls of said second gate;

forming a second pair of N type regions self-aligned with said first pair of sidewall spacers and a third pair of N type regions self-aligned with said second pair of sidewall spacers, said second and third pairs of N type regions being more heavily doped than said first pair of N type regions;

forming an N well in said layer of P type semiconductor material;

forming a third gate and a fourth gate over and insulated from said N well;

forming a third pair of sidewall spacers on sidewalls of said third gate and a fourth pair of sidewall spacers on sidewalls of said fourth gate;

forming an insulator layer over said N well, said insulator layer including a first pair of sidewall spacer extension regions formed over said third pair of sidewall spacers and a second pair of sidewall spacer extension regions formed over said fourth pair of sidewall spacers;

forming a first pair of P type regions self-aligned with said first pair of sidewall spacer extension regions and a second pair of P type regions self-aligned with said second pair of sidewall spacer extension regions;

connecting a first voltage source across said first and second pairs of N type regions and across said second pair of P type regions;

connecting a second voltage source across said third pair of N type regions and across said first pair of P type regions, said first voltage source supplying a larger voltage than said second voltage source.

11. A method for forming a semiconductor device, comprising the steps of:

forming first and second gates over and insulated from a layer of P type semiconductor material;

forming a first pair of N type regions self-aligned with said first gate;

forming a first pair of sidewall spacers on sidewalls of said first gate and a second pair of sidewall spacers on sidewalls of said second gate;

forming a second pair of N type regions self-aligned with said first pair of sidewall spacers and a third pair of N type regions self-aligned with said second pair of sidewall spacers, said second and third pairs of N type regions being more heavily doped than said first pair of N type regions;

forming an N well in said layer of P type semiconductor material;

forming a third gate and a fourth gate over and insulated from said N well;

forming a pair of N type regions in said N well self-aligned with said third gate;

forming a third pair of sidewall spacers on sidewalls of said third gate and a fourth pair of sidewall spacers on sidewalls of said fourth gate;

forming an insulator layer over said N well, said insulator layer including a first pair of sidewall spacer extension regions formed over said pair of third sidewall spacers and a second pair of sidewall spacer extension regions formed over said pair of fourth sidewall spacers;

forming a first pair of P type regions self-aligned with said first pair of sidewall spacer extension regions and a second pair of P type regions self-aligned with said second pair of sidewall spacer extension regions.

12. The method of claim 11 further comprising the steps of:

connecting a first voltage source across said first and second pairs of N type regions and across said second pair of P type regions;

connecting a second voltage source across said third pair of N type regions and across said first pair of P type regions, said first voltage source supplying a larger voltage than said second voltage source.

13. A method for forming a semiconductor device, comprising the steps of:

forming first and second gates over and insulated from a layer of P type semiconductor material;

forming a first pair of N type regions self-aligned with said first gate;

forming a first pair of sidewall spacers on sidewalls of said first gate and a second pair of sidewall spacers on sidewalls of said second gate;

forming a second pair of N type regions self-aligned with said first pair of sidewall spacers and a third pair of N type regions self-aligned with said second pair of sidewall spacers, said second and third pairs of N type regions being more heavily doped than said first pair of N type regions;

forming an N well in said layer of P type semiconductor material;

forming a third gate and a fourth gate over and insulated from said N well;

forming a pair of N type regions in said N well self-aligned with said third gate;

forming a third pair of sidewall spacers on sidewalls of said third gate and a fourth pair of sidewall spacers on sidewalls of said fourth gate;

forming a first pair of P type regions self-aligned with said third pair of sidewall spacers and a second pair of P type regions self-aligned with said fourth pair of sidewall spacers.

14. The method of claim 13 further comprising the steps of:

connecting a first voltage source across said first-and second pairs of N type regions and across said second pair of P type regions;

connecting a second voltage source across said third pair of N type regions and across said first pair of P type regions, said first voltage source supplying a larger voltage than said second voltage source.

15. A method for forming a semiconductor device, comprising the steps of:

forming first and second gates over and insulated from a layer of P type semiconductor material;

forming a first pair of N type regions self-aligned with said first gate;

forming a first pair of sidewall spacers on sidewalls of said first gate and a second pair of sidewall spacers on sidewalls of said second gate;

forming a second pair of N type regions self-aligned with said first pair of sidewall spacers and a third pair of N type regions self-aligned with said second pair of sidewall spacers, said second and third pairs of N type regions being more heavily doped than said first pair of N type regions;

forming an N well in said layer of P type semiconductor material;

forming a third gate over and insulated from said N well and a polysilicon strip over and insulated from said layer of P type semiconductor material;

forming a third pair of sidewall spacers on sidewalls of said third gate;

forming an insulator layer over said layer of P type semiconductor material, said insulator layer including a first pair of sidewall spacer extension regions formed over said third pair of sidewall spacers;

etching said insulator layer to expose opposite ends on said polysilicon strip;

forming a first pair of P type regions self-aligned with said first pair of sidewall spacer extension regions; and forming layers of silicide on said exposed ends of said polysilicon strip.

* * * * *